United States Patent
Cochrane

(10) Patent No.: US 10,838,024 B2
(45) Date of Patent: Nov. 17, 2020

(54) SELF-CALIBRATING SOLID-STATE MAGNETOMETER FOR VECTORIZED FIELD SENSING VIA ZERO-FIELD SPIN-DEPENDENT RECOMBINATION

(71) Applicant: CALIFORNIA INSTITUTE OF TECHNOLOGY, Pasadena, CA (US)

(72) Inventor: Corey J. Cochrane, Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 187 days.

(21) Appl. No.: 15/969,466

(22) Filed: May 2, 2018

(65) Prior Publication Data

US 2018/0321333 A1 Nov. 8, 2018

Related U.S. Application Data

(60) Provisional application No. 62/500,374, filed on May 2, 2017.

(51) Int. Cl.
| | | |
|---|---|---|
| *G01R 33/09* | (2006.01) | |
| *G01R 33/00* | (2006.01) | |
| *G01R 33/022* | (2006.01) | |
| *G01R 33/12* | (2006.01) | |
| *G01R 33/02* | (2006.01) | |

(52) U.S. Cl.
CPC ....... *G01R 33/091* (2013.01); *G01R 33/0017* (2013.01); *G01R 33/0035* (2013.01); *G01R 33/022* (2013.01); *G01R 33/0206* (2013.01); *G01R 33/1284* (2013.01)

(58) Field of Classification Search
CPC .............. G01R 33/091; G01R 33/0035; G01R 33/0206; G01R 33/022; G01R 33/1284; G01R 33/0017; A61N 1/0452; H01L 23/528
USPC ...... 324/200, 207.11–207.15, 211, 220, 233, 324/234–247, 252, 500, 529, 530, 160, 324/177, 169, 139, 765.01, 318, 304, 301, 324/322
See application file for complete search history.

(56) References Cited

U.S. PATENT DOCUMENTS

| | | | | |
|---|---|---|---|---|
| 2010/0321518 A1* | 12/2010 | Shinohara | ......... | H01L 27/14621 348/222.1 |
| 2014/0247048 A1* | 9/2014 | Cochrane | ............ | G01R 33/385 324/322 |
| 2015/0212168 A1* | 7/2015 | Shah | .................... | G01N 24/006 324/304 |

OTHER PUBLICATIONS

Baker, W.J. et al., "Robust Absolute Magnetometry with Organic Thin-Film Devices", Nature Communications, 3:898, (2012), 7 pages.

(Continued)

*Primary Examiner* — Vincent Q Nguyen
*Assistant Examiner* — Trung Nguyen
(74) *Attorney, Agent, or Firm* — Steinfl + Bruno LLP

(57) ABSTRACT

A self-calibrating solid-state magnetometer for vectorized field sensing via zero-field spin-dependent recombination is realized with a wide band gap semiconductor junction. Three sets of Helmholtz coils provide a cancellation field at low frequency, as well as a modulated field at audio frequencies. The presence of the hyperfine interactions in the zero-field response as well as the low-field electrically detected magnetic resonance detection capability allows for magnetometer self-calibration.

19 Claims, 35 Drawing Sheets

(56) References Cited

OTHER PUBLICATIONS

Cochrane, C.J. et al., Magnetic Field Sensing with 4H SiC Diodes: N vs P Implantation, Materials Science Forum, vol. 924, pp. 988-992, (2018). 6 pages.

Cochrane, C.J. et al., "Vectorized Magnetometer for Space Applications Using Electrical Readout of Atomic Scale Defects in Silicon Carbide", Scientific Reports, 6:37077, (2016), 13 pages.

Cochrane, C.J. et al., "Zero-Field Detection of Spin Dependent Recombination with Direct Observation of Electron Nuclear Hyperfine Interactions in the Absence of an Oscillating Electromagnetic Field," Journal of Applied Physics, 112, 123714, (2012), 7 pages.

Cochrane, C.J. et al., "Detection of interfacial Pbcenters in Si/SiO2 MOSFETs via zero-field spin dependent recombination withobservation of precursor pair spin-spin interactions," Appl. Phys, Lett., 103, 053506, (2013), 6 pages.

Smith, E. J., et al., "Measuring the Magnetic Fields of Jupiter and the Outer Solar System," IEEE Transactions on Magnetics, vol. MAG-11, No. 4, Jul. 1975. 19 Pages.

\* cited by examiner

Hamiltonian matrix elements of singlet triplet pairs in the presence of a $I = 1/2$ nucleus

| $\mathcal{H}$ | $\|T_+,\uparrow\rangle$ | $\|T_0,\uparrow\rangle$ | $\|S_0,\uparrow\rangle$ | $\|T_-,\uparrow\rangle$ | $\|T_+,\downarrow\rangle$ | $\|T_0,\downarrow\rangle$ | $\|S_0,\downarrow\rangle$ | $\|T_-,\downarrow\rangle$ |
|---|---|---|---|---|---|---|---|---|
| $\langle T_+,\uparrow\|$ | $\dfrac{g_e\mu_B B}{4} + \dfrac{\Sigma A_z}{4} + \dfrac{J_0}{4} + \dfrac{D_1}{3}$ | $0$ | $0$ | $D_2$ | $0$ | $\dfrac{\Sigma A_x - \Sigma A_y}{4\sqrt{2}}$ | $\dfrac{\Delta A_y - \Delta A_x}{4\sqrt{2}}$ | $0$ |
| $\langle T_0,\uparrow\|$ | $0$ | $\dfrac{J_0}{4} + \dfrac{D_1}{3}$ | $\dfrac{\Delta A_z}{4}$ | $0$ | $\dfrac{\Sigma A_x + \Sigma A_y}{4\sqrt{2}}$ | $0$ | $0$ | $\dfrac{\Sigma A_x - \Sigma A_y}{4\sqrt{2}}$ |
| $\langle S_0,\uparrow\|$ | $0$ | $\dfrac{\Delta A_z}{4}$ | $-\dfrac{3J_0}{4}$ | $0$ | $\dfrac{\Delta A_x + \Delta A_y}{4\sqrt{2}}$ | $0$ | $0$ | $\dfrac{\Delta A_x - \Delta A_y}{4\sqrt{2}}$ |
| $\langle T_-,\uparrow\|$ | $D_2$ | $0$ | $0$ | $\dfrac{-g_e\mu_B B}{4} + \dfrac{\Sigma A_z}{4} + \dfrac{J_0}{4} + \dfrac{D_1}{3}$ | $0$ | $\dfrac{\Sigma A_x + \Sigma A_y}{4\sqrt{2}}$ | $\dfrac{\Delta A_x + \Delta A_y}{4\sqrt{2}}$ | $0$ |
| $\langle T_+,\downarrow\|$ | $0$ | $\dfrac{\Sigma A_x + \Sigma A_y}{4\sqrt{2}}$ | $\dfrac{\Delta A_x + \Delta A_y}{4\sqrt{2}}$ | $0$ | $\dfrac{g_e\mu_B B}{4} + \dfrac{\Sigma A_z}{4} + \dfrac{J_0}{4} + \dfrac{D_1}{3}$ | $0$ | $0$ | $D_2$ |
| $\langle T_0,\downarrow\|$ | $\dfrac{\Sigma A_x - \Sigma A_y}{4\sqrt{2}}$ | $0$ | $0$ | $\dfrac{\Sigma A_x + \Sigma A_y}{4\sqrt{2}}$ | $0$ | $\dfrac{J_0}{4} + \dfrac{D_1}{3}$ | $\dfrac{\Delta A_z}{4}$ | $0$ |
| $\langle S_0,\downarrow\|$ | $\dfrac{\Delta A_y - \Delta A_x}{4\sqrt{2}}$ | $0$ | $0$ | $\dfrac{\Delta A_x + \Delta A_y}{4\sqrt{2}}$ | $0$ | $\dfrac{\Delta A_z}{4}$ | $-\dfrac{3J_0}{4}$ | $0$ |
| $\langle T_-,\downarrow\|$ | $0$ | $\dfrac{\Sigma A_x - \Sigma A_y}{4\sqrt{2}}$ | $\dfrac{\Delta A_x - \Delta A_y}{4\sqrt{2}}$ | $0$ | $D_2$ | $0$ | $0$ | $\dfrac{-g_e\mu_B B}{4} + \dfrac{\Sigma A_z}{4} + \dfrac{J_0}{4} + \dfrac{D_1}{3}$ |

FIG. 10

SELF-CALIBRATING SOLID-STATE MAGNETOMETER FOR VECTORIZED FIELD SENSING VIA ZERO-FIELD SPIN-DEPENDENT RECOMBINATION

CROSS REFERENCE TO RELATED APPLICATIONS

The present application claims priority to U.S. Provisional Patent Application No. 62/500,374, filed on May 2, 2017, the disclosure of which is incorporated herein by reference in its entirety.

STATEMENT OF INTEREST

The invention described herein was made in the performance of work under a NASA contract NNN12AA01C, and is subject to the provisions of Public Law 96-517 (35 USC 202) in which the Contractor has elected to retain title.

TECHNICAL FIELD

The present disclosure relates to magnetic sensing. More particularly, it relates to a self-calibrating solid-state magnetometer for vectorized field sensing via zero-field spin-dependent recombination.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 10 illustrates the Hamiltonian matrix elements of the singlet triplet pair in the presence of a single magnetic nucleus.

SUMMARY

Figure 1:
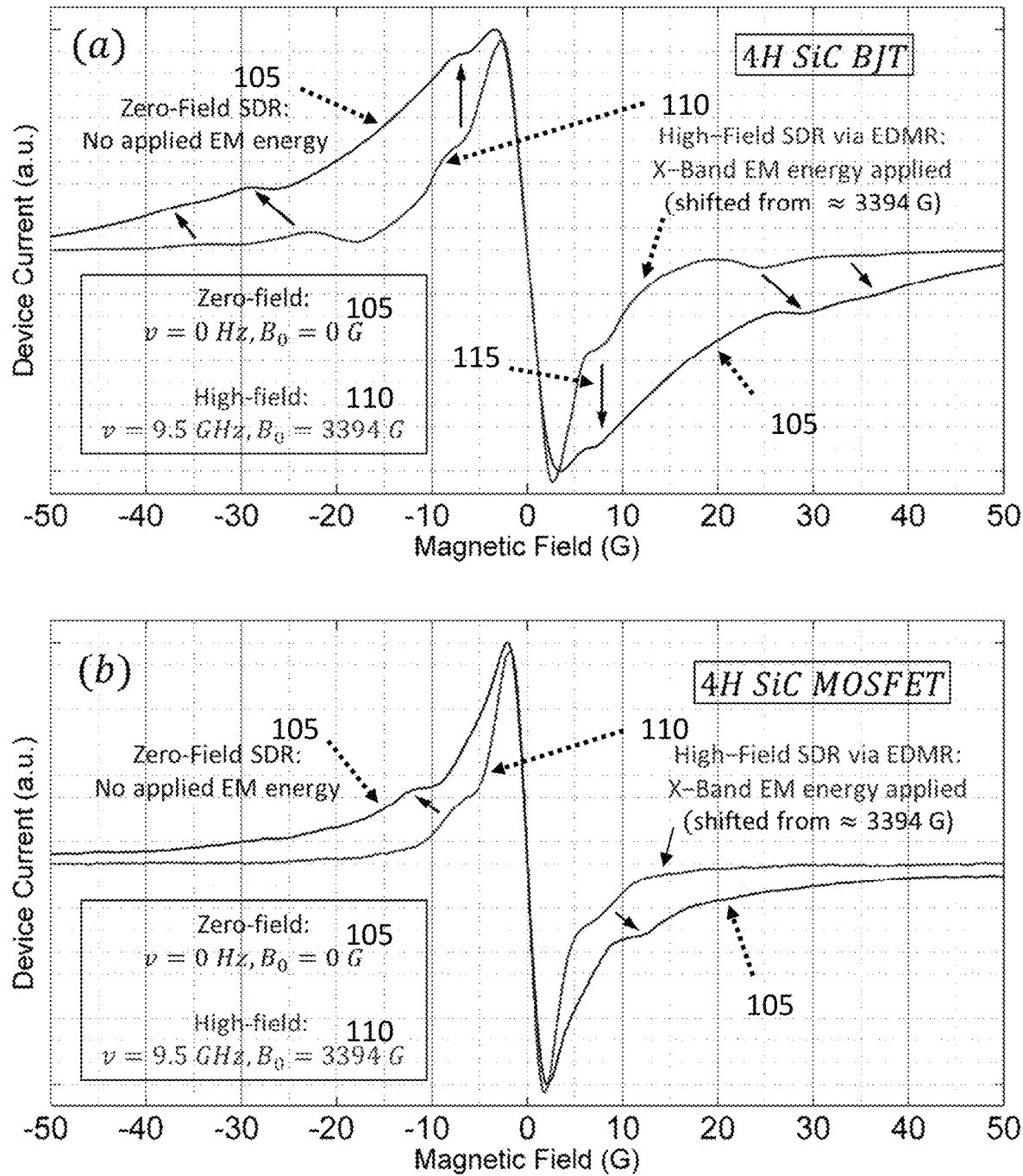
FIG. 1 illustrates a comparison of the zero-field and high-field (detected via EDMR) SDR spectra for two different junctions.

In a first aspect of the disclosure, a magnetometer is described, the magnetometer comprising: a semiconductor pn junction having a first region and a second region, the first region being an electron carrier region, and the second region being a hole carrier region; three sets of Helmholtz coils, the three sets of Helmholtz coils being mutually orthogonal, each set of Helmholtz coils comprising two circular coils configured to generate a homogenous magnetic field in a direction that is perpendicular to the plane of the two circular coils, thus generating three mutually orthogonal magnetic field components; and electronic circuitry configured to: drive current into each of the three sets of Helmholtz coils to generate the three mutually orthogonal magnetic field components which cancels the ambient magnetic field by maximizing a spin-dependent recombination current in the semiconductor pn junction, thereby measuring an external magnetic field based on the current driven in each set.

DETAILED DESCRIPTION

The present disclosure describes a self-calibrating solid-state based magnetometer for vectorized field sensing via zero-field spin-dependent recombination in silicon carbide microelectronics. There have been a variety of magnetometers developed over the past few decades to provide magnetic field sensing capabilities for various applications. This list includes, but is not limited to, fluxgate sensors, inductive pickup coils, superconducting quantum interference devices (SQUID), spin-exchange relaxation-free (SERF), optically pumped atomic gas, electrically detected magnetic resonance (EDMR), optically detected magnetic resonance (ODMR), conventional magnetoresistance based solid-state sensors, and Hall Effect sensors. While each of these magnetometers has its respective benefits, each also has its shortcomings. Some of the more desired magnetometer attributes include an inexpensive and simple design, high sensitivity and stability, scalable design, light weight, small footprint, no moving parts, temperature intolerant circuitry, a purely electrical design with digital readout, an ability to operate in harsh environments, an ability to self-calibrate, and vectorized or bipolar-based field sensing. While many of the listed magnetometers address these issues individually, not many address them as a whole. Of the exemplary options listed above, the magnetometer that is closest to fulfilling the full list of desired attributes is the fluxgate-based magnetometer.

Fluxgates are often used for near zero magnetic field sensing in space applications where simplicity, size, and weight are of the highest concern. While not as sensitive as SQUIDs, SERFs, or atomic gas based sensors, fluxgate sensors are still relatively stable and have moderately high sensitivity to magnetic fields (of the order of 10-100 pTHz⁻

1/2). Even though significant progress has been made to miniaturize these magnetometers, the incorporation of a magnetically susceptible core wrapped with driving and detection coils will always limit the size, weight, and purely electrical characteristic of the technology. Solid-state magnetometers based on magnetoresistance address these issues while maintaining an inexpensive and simplistic design; however, the magnetoresistive magnetometers currently lack the sensitivity to compete with the fluxgate technology. Additionally, the underlying mechanisms which drive the many forms of magnetoresistance are not yet all completely understood. The complexity of reaching a complete theoretical understanding of magnetoresistance is due to the intricate structures and complex ferromagnetic material systems that are commonly used within these devices. The lack of a complete theory adds risk and uncertainty to many of the magnetoresistive-based technologies, especially if operated in high temperature or high radiation environments. Thus, a miniaturized solid-state magnetometer with comparable fluxgate sensitivity remains elusive to this day.

The present disclosure describes the sensitive detection of magnetic fields using the recently demonstrated zero-field spin dependent recombination (SDR) phenomenon. Spin dependent recombination naturally arises from atomic-scale, deep-level defects within silicon carbide (SiC) microelectronic devices. The SDR phenomenon provides these solid-state devices with magnetoresistive properties which make them ideal for the development of miniaturized and purely electrically-based magnetometers. Similar to fluxgates, the proposed technology is inexpensive, relatively simple to implement, and allows for a moderately high sensitivity to be achieved.

The zero-field SDR phenomenon allows for a change in device current to be detected when a magnetic field is linearly swept across zero Gauss. The zero-field SDR response, even though generally broader than the typical detection of SDR via electrically-detected magnetic resonance (EDMR) made at higher magnetic fields, has a very similar zero-crossing slope when utilizing magnetic field modulation. As a result, this magnetoresistance phenomenon can be exploited for near-zero magnetic field sensing. Magnetic field modulation also allows for the electrical detection of the zero-field electron-nuclear hyperfine interactions. This magnetic coupling phenomenon involves interaction of the unpaired electron(s) in the atomic scale defect with the magnetic host and dopant atoms (e.g. Al, N, B, Ga, As, or P) in SiC. Essentially, when a recombination event occurs in the presence of one of the dopant magnetic nuclei, the field seen by the unpaired electron(s) at the defect site will be the sum of the dipole-like field generated by the nuclei and the external field in which the device is immersed. As a result, depending on the defect structure and host atoms utilized, the observation of additional smaller peaks will be observed, and appear shifted from actual zero-field. As the location of these peaks is dependent upon fundamental physical constants in nature, the peaks will always maintain their respective spacing and therefore may serve as stable magnetic field markers for a magnetometer self-calibration.

Many semiconductor materials that involve defect-aided recombination can also exhibit zero-field SDR, therefore, in some embodiments, other semiconductors may be used instead of SiC. For example, conventional devices of silicon metal-oxide-semiconductor field-effect transistors (MOSFETs) can exhibit SDR when stressed. However, the SiC material itself is better suited for magnetometry for many reasons, as explained in the following. The 4H—SiC polytype has a bandgap of 3.2 eV which makes it inherently radiation-hard and allows for operation in high-temperature environments. Additionally, its non-amorphous nature allows the zero-field response to be relatively sharp, in turn allowing for moderately high sensitivities to be achieved. It was recently demonstrated that the EDMR detection of SDR in an organic based amorphous semiconductors could be used to achieve sensitives as low as 50 nTHz$^{-1/2}$. This metric is dependent on shot noise, the change in SDR current, bandwidth of operation, and the sharpness of response. The "as-processed" SiC devices have similar properties, and can even be further altered through defect engineering or device stressing to improve upon this sensitivity metric. Also, only a single device (e.g. having an area <1 μm$^2$) is required for sensing the field which means it can be made extremely small and light weight. The minimal analog circuitry required allows for potential applications in a microelectromechanical (MEMs) system.

The present disclosure describes, in some embodiments, a magnetometer based on a magnetic field cancellation scheme controlled by one or more proportional integral (PI) controllers, which maximizes the zero-field SDR current in a SiC solid-state device by maintaining a local region of zero-magnetic field across the volume of the device. The SiC sensor can be housed within three sets of Helmholtz coils (1 for each xyz or Cartesian dimension), which can be driven independently to provide the low frequency (<50 Hz) cancellation field, as well as the alternating current (AC) audio modulation fields at orthogonal frequencies. Depending on the flicker noise in the measurement, the modulation frequency can be chosen anywhere in the range between 50 Hz to 50 kHz. As the driving current in a Helmholtz coils is directly proportional to the magnetic field it generates, its measure can serve as an indirect measure of the field being cancelled in each dimension.

The change induced by the magnetic field in the SDR current of the SiC sensor is first conditioned by a preamplifier before it is digitized for optimum sensitivity. The first stage of the analog front-end involves current-to-voltage conversion and amplification using a high gain transimpedance amplifier mounted near the sensor. This stage is followed by a differential amplifier which is used to subtract out common mode noise and modulation artifacts picked up by the signal and ground leads of the sensor and front-end amplifier. A high-pass filter (HPF) is used to block the sensor's direct current (DC) which AC couples the signal for improved dynamic range. An additional fine tune gain can be implemented, followed by an anti-aliasing low-pass filter (LPF) prior to digitization of the signal. The preamplifier therefore comprises, in some embodiments, the current to voltage conversion operational amplifier (1705) in FIG. 17, as well as the HPF (1710), gain opamp (1715), and LPF (1720).

The conditioned signal is then digitized and fed into three independent (1 for each xyz axis), user configurable, digital demodulators. Each demodulator is used to measure the change in SDR current induced in each axis. As a result, the software-generated modulation sinusoid for each of the three xyz axes must be configured to have a frequency which is not a harmonic of the other two. This method allows for the three vectorized magnetic field components to be frequency-division multiplexed onto a single channel, and also allows for the demodulation of higher order harmonics, for more sensitive magnetic field sensing.

The demodulator involves an (optional) first stage of digital bandpass filtering, subsequently followed by a mixer which performs a point-by-point multiplication of the incoming signal with a time-synchronized, user-configured (demodulating harmonic and demodulating phase) sinusoid. This operation shifts half of the signal to DC and the other half of the signal to twice the modulation frequency. A low-pass filter can be used to remove the high frequency component, and an exponential averaging block can be used to further reduce noise on the remaining signal, based upon the user-configured bandwidth.

A digital proportional integral (PI) controller can be implemented for each of the three demodulation channels, and used to calculate the required current to be fed through each Helmholtz coil in order to maintain a local region with a magnetic field of zero value. These calculated currents can be added to the modulation waveform via the software, prior to digital-to-analog conversion. The setpoint of the controller can be set to track the zero crossing of the first harmonic, or features of the higher order harmonics for more sensitive field tracking. The setpoint can alternatively be linearly swept to measure the SDR spectrum as a function of applied coil current. This spectrum can be utilized to self-calibrate the magnetometer, if the measurement detects changes in the spacing of the well-defined electron-nuclear hyperfine peaks.

A further component of the magnetometer is the driving circuitry for the Helmholtz coils. As the analog voltage being fed into the driving circuit represents the appropriate current (and modulation sinusoid) needed to cancel the external magnetic field, it needs to be converted to a current. Depending on the properties of the Helmholtz coils used and the desired sensitivity range, a voltage-to-current amplifier can be used for this task.

Inductive coils are widely used in space because they are very small, inexpensive, and simple to implement. However, these coils are only able to sense AC fields and therefore are not useful for low frequency magnetic field sensing. Fluxgates are commonly used for this purpose because not only are they capable of low frequency measurements, but they also are inexpensive, robust, stable, have great sensitivity, and do not require high frequency components. However, there are limitations as to how small and lightweight they can be made. Additionally, as ferromagnetic cores with driving and sensing coils are required, fully electrical systems cannot be fully realized. The technology described herein has comparable sensitivity to fluxgate sensors while also being fully electrical (with digital read out), and able to be miniaturized into a MEMS package as only a single microelectronic device is required.

Approaches based on magnetic resonances, such as nuclear magnetic resonance (NMR), EDMR, and ODMR have shown much promise for absolute magnetometry. These techniques all rely on nuclear or electronic resonant transitions in atomic gas or semiconductor devices, induced by radiation, either optical or high-frequency radiofrequency (RF). While leveraging fundamental physical constants in nature to achieve high sensitivity, these sensors cannot be miniaturized, are highly complex, expensive, and require high frequency, temperature-dependent, circuitry which adds risk and complexity to the instrument.

The approach described in the present disclosure, in some embodiments, only requires low frequency (audio frequency) circuitry for magnetic field measurements. Additionally, in some embodiments, the approach described herein does not require a resonant condition search prior to measurement, which reduces the complexity of the controlling software. The methods of EDMR and ODMR, which use semiconductors as the sensing medium, are not well suited for operation in high radiation environments. Radiation can render these magnetometers useless by creating defects with resonances different than those originally associated with the sensing device.

In the devices based on SDR as described in the present disclosure, the above disadvantages are resolved. For example, if different defects are created by radiation within the device, such as during a space mission, the zero-field SDR signal would actually grow in amplitude. Thus, the magnetometer would remain functional with a slight possibility of degradation in sensitivity (due to broader lines) and unusable self-calibrating feature (alteration of hyperfine peaks). However, even this possibility is not expected because the wide bandgap of SiC gives the material a high resistance to radiation damage, with the additional benefit that this material can be used in high temperature environments.

The SDR magnetometer described in the present disclosure is based on a solid-state device, but it differs from existing solid-state technologies in many ways. For example, while Hall effect sensors are intended to measure high magnetic fields, the SDR magnetometer is more adequately used for sensing near zero magnetic fields. Also, although the zero-field SDR phenomenon in SiC is based on magnetoresistance, it does not involve the same transport mechanisms or ferromagnetic materials utilized in more conventional magnetoresistance sensors such as those based on anisotropic magnetoresistance (AMR), giant magnetoresistance (GMR), and tunneling magnetoresistance (TMR). The materials utilized in the SDR magnetometer described in the present disclosure, such as SiC, and its dopant atoms (Al, N, B, or P), are not ferromagnetic and rely on device structures such as diodes or MOSFETs.

Additionally, unlike some of the conventional magnetoresistance sensors such as those based on colossal magnetoresistance (CMR), the underlying mechanism which drives the SDR effect is well understood, theoretically. Unlike the magnetoresistance associated with organic semiconductors, the SiC material system is crystalline, which allows for a sharper, more sensitive, response. The response is even further sharpened by leveraging magnetic field modulation and demodulation of higher order harmonics, which are configurable in the controlling software. The modulation technique also reduces noise, prevents drift, allows vectorized field sensing, and allows for the observation of electron-nuclear hyperfine interactions, in turn allowing for self-calibration. Vectorized field sensing comprises detecting the orientation of the magnetic field, which is possible by detecting each field component in a three-axis coordinate system, such as Cartesian xyz coordinates.

The SDR magnetometers described herein can be made extremely small and, in some embodiments, do not require any high frequency circuitry, thus reducing risk and eliminating the need to maintain strict temperature values for accurate and reliable magnetic field measurements. The combination of these features, along with being purely electrical and inexpensive, enables the technology to be used for a variety of magnetic field sensing applications, including planetary entry probes, landers, missions in extreme environments such as Venus, and in swarms of spacecraft significantly smaller than current nanosats.

FIG. 1 illustrates a comparison of the zero-field (105) and high-field (110) SDR spectra, detected via EDMR, of: panel a) the base collector junction of a 4H SiC BJT; and panel b) a 4H SiC MOSFET. The similarity in sharpness (and center-field slope) between the zero-field and high-field responses can be noted in both devices. This suggests that the zero-field SDR response can have comparable sensitivities (on the order of a few $nTHz^{-1/2}$, for example less than 5 or less than 10 nTHz$^{-1/2}$) to that of EDMR magnetometers. It can also be noted that electron-nuclear hyperfine interactions observed in the high-field SDR responses can also be discerned in the zero field responses. These hyperfine interactions are indicated in FIG. 1 by arrows having a continuous line such as arrow (115). As the spacing of these hyperfine features is a fundamental physical constant in nature, the hyperfine features can be used for magnetometer self-calibration. These inflection features can be further enhanced by demodulating higher order harmonics.

Figure 2:
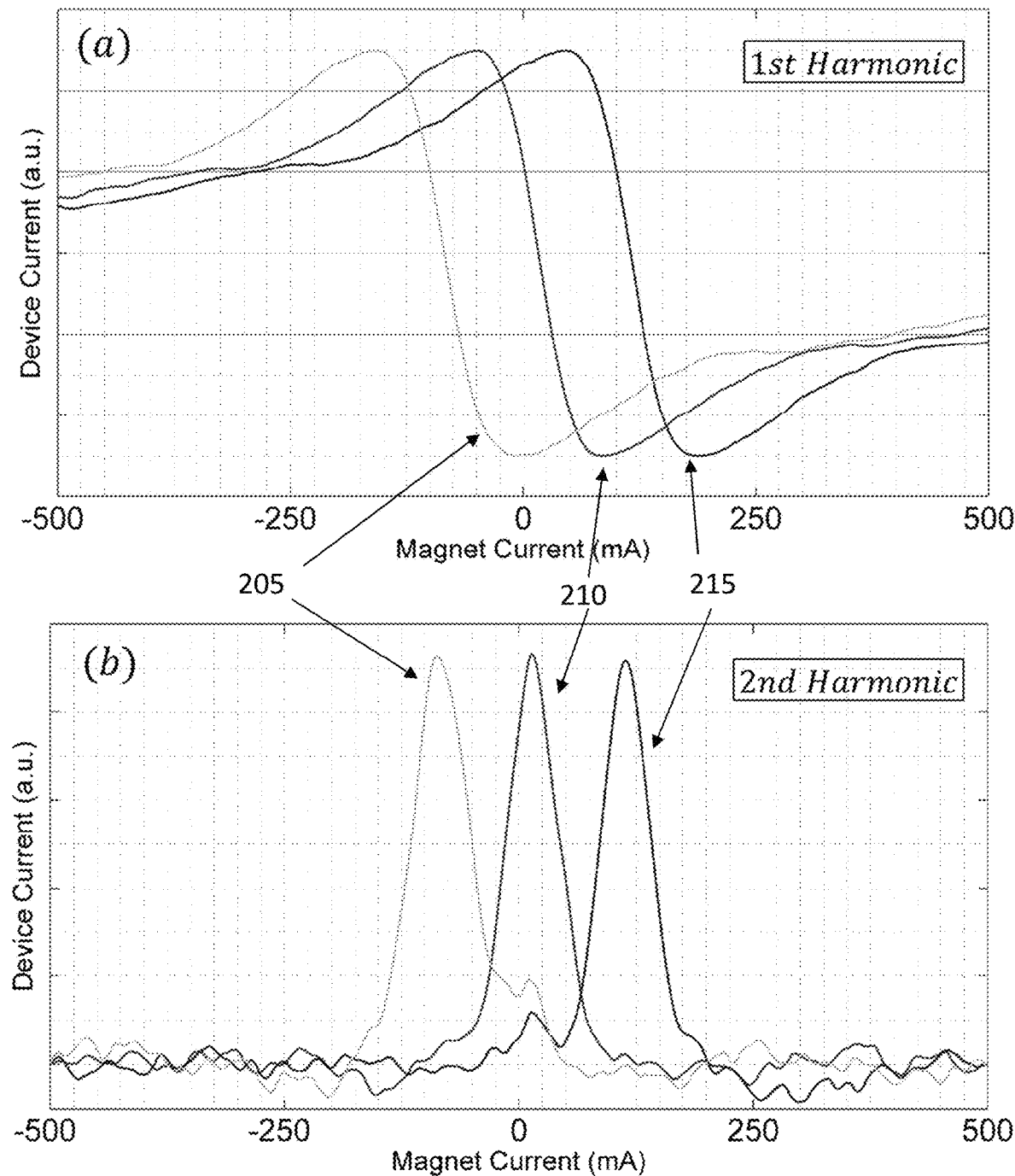
FIGS. 2-3 illustrate exemplary data demonstrating the use of the SDR current.

FIG. 2 illustrates exemplary data demonstrating the use of the SDR current in a 4H SiC npn BJT as a magnetic field sensor. FIG. 2 illustrates in panel a) $1^{st}$ harmonic and in panel b) $2^{nd}$ harmonic responses of the SDR current as a function of induced electromagnet current. The three curves in each figure are the spectra acquired in the absence of an external field (210), the spectra acquired in the presence of a negative field (205), and the spectra acquired in the presence of a positive field (215).

Figure 3:
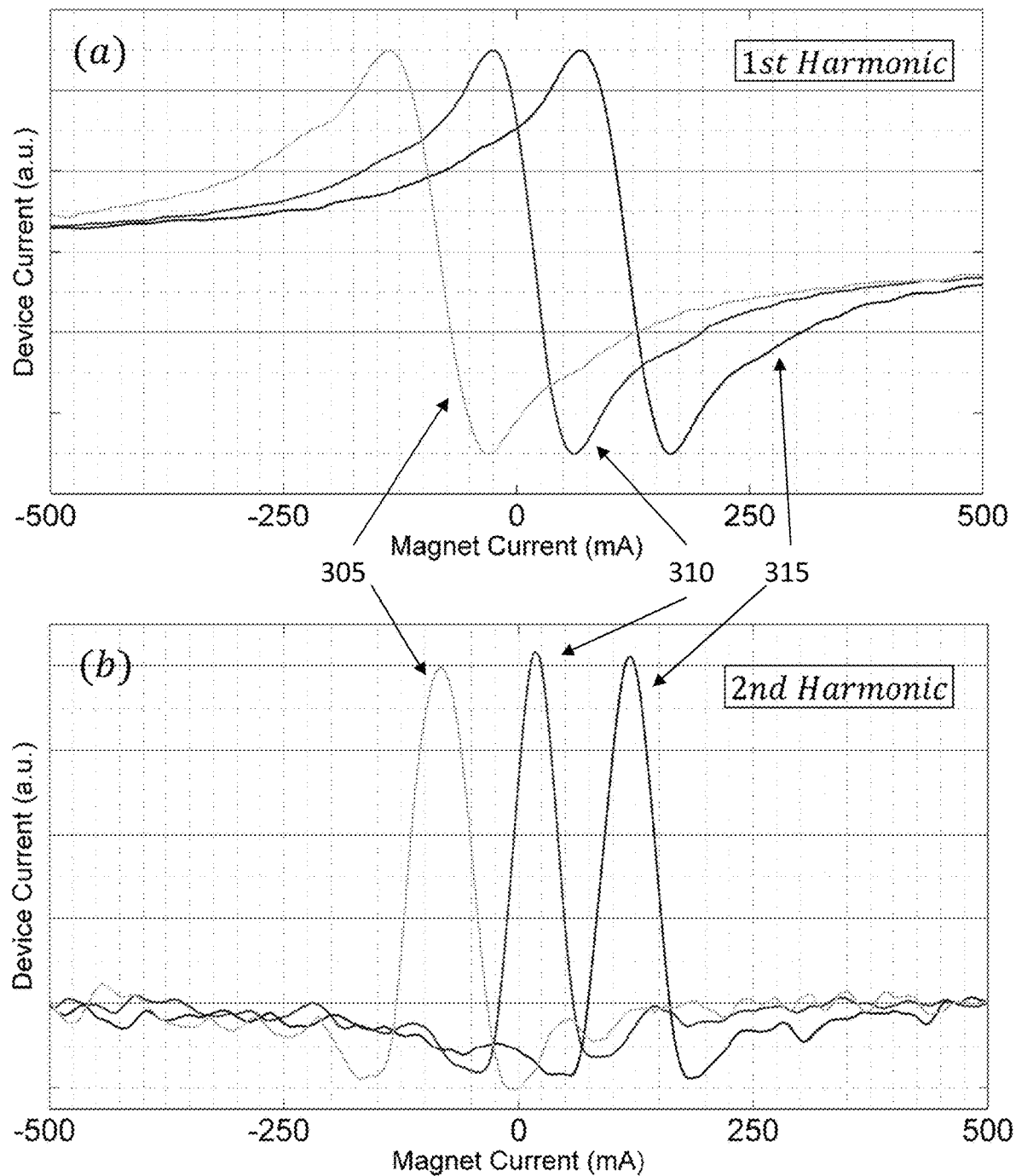

FIG. 3 illustrates exemplary data demonstrating the use of the SDR current in a 4H SiC nMOSFET as a magnetic field sensor. FIG. 3 illustrates in panel a) $1^{st}$ harmonic and in panel b) $2^{nd}$ harmonic responses of the SDR current as a function of induced electromagnet current. The three curves in each figure are the spectra acquired in the absence of an external field (310), the spectra acquired in the presence of a negative field (305), and the spectra acquired in the presence of a positive field (315).

Figure 4:
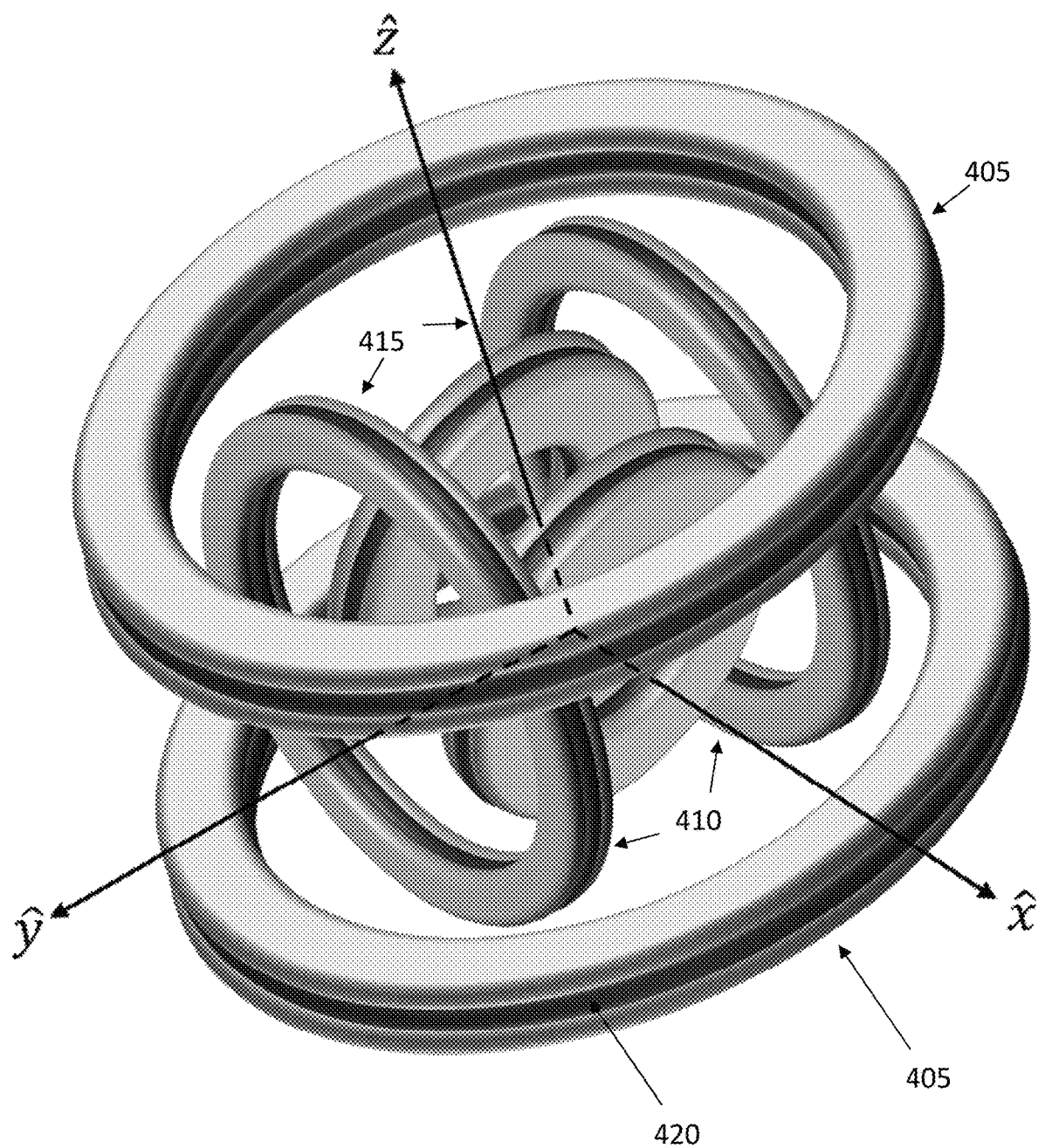
FIG. 4 illustrates a conceptual illustration of a 3-axis set of Helmholtz coils housing a sensor.

FIG. 4 illustrates a conceptual illustration of a 3-axis set of Helmholtz coils which houses the sensor and analog signal conditioning circuit. Each set of coils (405, 410, 415) is used to provide an AC modulated magnetic field (each dimension utilizing an orthogonal audio frequency) and a low frequency (e.g. less than 50 Hz or less than 10 Hz) cancellation field to maintain a local region of zero-magnetic field at its interior. As a single microelectronic device is required for field sensing, these coils can be manufactured at the micro scale for incorporation into a microelectromechanical system (MEMS) package. A wire (420) is coiled around a circular supporting structure to fabricate each coil.

Figure 5:
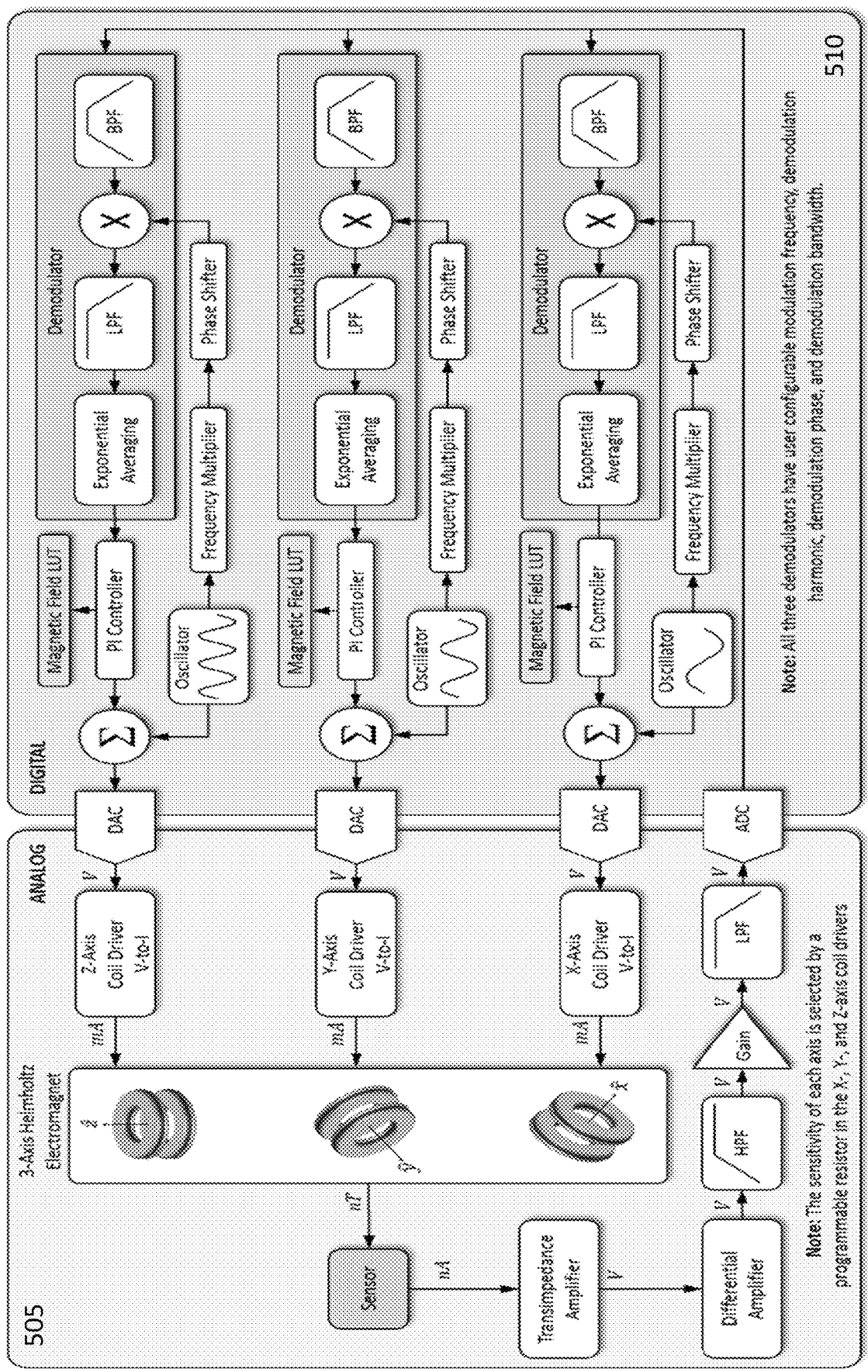
FIG. 5 illustrates a block diagram of an exemplary magnetometer.

FIG. 5 illustrates a block diagram of an exemplary magnetometer. In this example, the analog (505) front-end consists of a 5 stage current conditioning circuit for optimizing the SiC sensor current prior to digital-to-analog conversion. The analog back-end consists of the current driving circuitry for each set of Helmholtz coils. The digital portion (510) of the magnetometer includes, in this example, three user-configurable demodulators, each with user selectable modulation frequency, demodulation harmonic, demodulation phase, and demodulation bandwidth. The digital section also includes three independent PI controllers whose outputs are indicative of the current needed in each Helmholtz coil to maintain a local region of zero magnetic field across the volume of the sensor.

As discussed above in the present disclosure, magnetometers are essential instruments for the scientific investigation of planetary bodies and are therefore ubiquitous on missions in space. Fluxgate and optically pumped atomic gas based magnetometers are typically flown because of their proven performance, reliability, and ability to adhere to the strict requirements associated with space missions. However, their complexity, size, and cost prevent their applicability in smaller missions involving Cubesats. Conventional solid-state based magnetometers pose a viable solution, though many are prone to radiation damage and plagued with temperature instabilities. By contrast, the devices described in the present disclosure are self-calibrating, solid-state magnetometers which measure changes in current induced by a magnetic field within a SiC pn junction, caused by the interaction of external magnetic fields with the atomic scale defects intrinsic to the semiconductor. Unlike heritage designs, this type of magnetometer does not require inductive sensing elements, high frequency radio, and/or optical circuitry, and can be made significantly more compact and lightweight, thus enabling missions leveraging swarms of Cubesats capable of science returns not possible with a single large-scale satellite. Additionally, the robustness of the SiC semiconductor allows for operation in extreme conditions such as the hot Venusian surface and the high radiation environment of the Jovian system.

Planetary science has identified a strong need for scientific instruments which address crosscutting themes such as: building new worlds, planetary habitats, and understand the solar system. Addressing aspects of all of these themes, magnetometers remotely probe the interiors of solar system bodies without the need to invasively penetrate the bodies being investigated. Magnetic field measurements have been used to better understand the internal workings of planetary objects and have also been used in conjunction with simulations and models to shed insight into the predictive formation and evolution of the planets, satellites, and even the solar system. They also allow for a better understanding of planetary atmospheres and their interaction with the solar wind, which influences climate and the ability to harbor life. Magnetic field measurements have also been useful for indirect detection of water, a requirement for life similar to that present on Earth. For example, by measuring the gyration frequency of the ionized gas ejected from Enceladus' southern plumes in the presence of Saturn's magnetic field, it was determined that the outgassing material is consistent with ionized water vapor.

The most widely utilized magnetometers for measuring DC magnetic fields in are fluxgates and optically pumped atomic gas. Solid-state based magnetometers, such as Hall and magnetoresistive based sensors, have only recently been seriously considered for space missions due to the relative infancy of the technology and the uncertainty of performance in the harsh environments of space. However, they are gaining significant interest as the semiconductor industry is continually making large strides to improve material systems that are resilient to the highly varying temperatures and radiation environments typically encountered in space and other planetary systems.

Fluxgate magnetometers are most often used for near-zero DC magnetic field sensing in space applications where simplicity and cost are of the highest concern. A fluxgate magnetometer is composed of a ferromagnetic core wrapped with three sets of coils. The first set of coil is used to drive the core into and out of saturation, and the second set is used to sense the induced effect. Because the response of the ferromagnetic core is nonlinear, the induced signal will be rich in harmonics which can be used as a reference to null the external field with a third set of coils. While not the most sensitive option for space bound magnetometers, fluxgate sensors are moderately stable and can exhibit high sensitivity (e.g. 100 pT/$\sqrt{Hz}$). Sigma-delta analog-to-digital converters (ADC) technology with improved sampling resolution has been leveraged to enhance sensitivity of magnetometers. However, the incorporation of a magnetically susceptible core wrapped with driving, sensing, and nulling coils for each axis will always limit the size and weight, and will never lead to a purely electrical device.

For applications where higher sensitivities and better stability are required, optically pumped He magnetometers are the most common choice. While being the most sensitive and stable magnetometers used in space, the optically pumped helium magnetometers are more complex as their scalar-based design (which can also be configured in vectorized mode) requires two sources of RF excitation, an optical pumping source, and an optical sensor.

In these magnetometers, the first RF source excites the He atoms from their ground state $1^1S_0$ to a metastable state $2^3S_1$. This transition forces the electrons within the atoms from their singlet state (net spin angular momentum of S=0, $m_s$=0) to a triplet state (S=1, $m_s$=−1, 0, +1), which makes the system active for electron paramagnetic resonance (EPR). Optical pumping of the metastable He gas using right-hand circularly polarized light with λ=1083 nm provides a source of angular momentum $m_J$=−1 to depopulate the $m_s$=+1 state into the $2^3P_0$ excited state which results in a system with net magnetization due to the remaining electrons in the $m_s$=−1 state. Left-hand circularly polarized light with angular momentum of $m_J$=+1 could also be used to depopulate the $m_J$=−1 state.

After some time, the majority of the photons from the optical source will completely pass through the gas because absorption of the $m_s$=−1,0 states is forbidden due to conservation of angular momentum. An optical detector on the opposite side of the He gas monitors the optical pumping efficiency and controls the frequency v of a second RF source which maintains the EPR condition of the electrons in the $m_s$=−1 state. The resonance condition is defined by hv=$\Delta m_s g \mu_B B$, where h is Planck's constant, $\Delta m_s$ is the difference in spin angular momentum quantum numbers of the spin states, g is the electron's g-factor, $\mu_B$ is the Bohr magneton, and B is the external magnetic field to be measured. When satisfied, the electron spins are able to flip which eventually equally populates the metastable states thereby destroying the magnetization. This allows for an increase in optical pumping efficiency to be measured by the optical detector. The frequency v is therefore a direct measure of the external magnetic field in which the He gas is immersed. These magnetometers achieve the highest sensitivity and stability for space applications at the cost of using high frequency RF and optical circuitry. These components not only add cost, size, and complexity to the instrument, but they also require stable temperatures for operation.

Solid-state based magnetometers have very limited history in space missions. These magnetometers fall into three main categories: Hall sensors, magnetoresistance sensors, and sensors based on the magnetic resonance of semiconductor defects. Hall sensors function by measuring a voltage across an appropriately biased, precisely doped, semiconductor. Hall sensors are not ideal for sensitive magnetic field measurements in space, because they have a sensitivity proportional to the magnetic field strength, therefore making them ill-suited for near-zero field sensing. Hall sensors are also prone to temperature drift as well as prone to radiation damage as most are typically made from silicon. SiC based Hall sensors have previously been developed for higher magnetic field sensing applications.

Magnetoresistance devices normally involve changes, induced by a magnetic field, in the resistance of layered ferromagnetic structures, some of which include ordinary (OMR), anisotropic (AMR), giant (GMR), and tunneling magnetoresistance (TMR). These sensors have outstanding reliability concerns with regard to their overall stability, temperature stability, and radiation hardness. Additionally, even though these types of sensors can be made extremely small, because most of their responses are orientation dependent, multiple sensors are usually required for simultaneous measurement of three axes, which can add complexity.

The solid-state magnetic resonance approaches, including EPR, electrically detected magnetic resonance (EDMR), and optically detected magnetic resonance (ODMR), are based on detecting the resonances of unpaired electrons tied up in atomic scale defects within the semiconductor. Some sensors sense defects within a SiC material system as its wide bandgap allows for operation in high temperature and high radiation environments. Even though a wide bandgap material is usually termed "rad-hard" or "radiation-hard", SiC can still be prone to point defect creation in very high radiation environments. As a result, the tuned resonance condition of these magnetometers may be altered due to the creation of defects with Lande g values different than those intended to be sensed, thereby changing the anticipated response and making the measurement unreliable.

The above resonance approaches also rely on high frequency optical and radio circuitry which adds complexity, cost, and reliability concerns. As a result, a fully reliable solid-state magnetometer for space applications remains elusive to this day. The present disclosure is based on the latter two forms of solid-state magnetometers: it leverages atomic scale defects to sense magnetic fields; however, it measures the associated magneto response that allows for field measurements without any high frequency circuitry or optical components, thereby simplifying the measurements.

The technique described herein involves the detection of magnetic fields using the zero-field spin dependent recombination (ZFSDR) in SiC electronics, as described in Ref. [1]. The ZFSDR phenomenon provides these solid-state devices with magnetoresistive properties, which makes them ideal for the development of miniaturized and purely electrical magnetometers for near-zero magnetic field sensing (|B|<10 uT). Similar to fluxgates, the SiC magnetometer (which can be termed herein "SiCMag") is inexpensive, relatively simple to implement, and does not include high frequency RF or optical components which are sensitive to slight changes in temperature. Additionally, in some embodiments only a single microelectronic device (with sensing area of less than 0.01 mm$^2$) is required for simultaneous measurement of three magnetic axes. Therefore, the SiC magnetometer is more adaptable to smaller space missions which leverage nano- and picosats where fluxgate and optically pumped based designs are too large for implementation. These smaller satellites are categorized as having a mass in the range 0.1 to 10 kg.

The magneto-response related to defects has also been observed in Si electronics and organic based semiconductors, however the semiconductor properties of SiC are significantly more robust than its counterparts. Although the SDR phenomenon can be observed at temperatures as low as −260° C., in some embodiments the sensors are not operated at such low temperatures. Like most magnetometers flown in space, the sensor can be housed in a small enclosure which can be space heated, for example no warmer than −120° C. Additionally, although the SiC semiconductor can operate reliably in temperatures to those encountered on the Venusian surface (≈460° C.), the magnetometer's maximum operating temperature limit will likely be determined by the robustness of the supporting SiC electronics that are integrated with it. However, some SiC integrated circuits (IC) can reliably operate at 500° C. for more than 1000 hours.

In some embodiments, the magnetometers of the present disclosure comprise a 4H—SiC pn junction. The junction's sensitivity to magnetic fields arises from intrinsic, deep level, atomic scale defects that play a dominating role in SDR. When a device is voltage-biased to yield a recombination-dominated current, semiconductor conduction electrons couple with electrons associated with deep level defects. These intermediate coupled pair states can be described by the singlet-triplet basis: the symmetric triplet states, $T_+=|\uparrow\uparrow\rangle$, $T_0=(|\uparrow\downarrow\rangle+|\downarrow\uparrow\rangle)/\sqrt{2}$, and $T_-=|\downarrow\downarrow\rangle$, each having spin angular momentum S=1 with $m_s$=+1, 0, −1 respectively or the anti-symmetric singlet state, $S_0=(|\uparrow\downarrow\rangle-|\downarrow\uparrow\rangle)/\sqrt{2}$ which has spin angular momentum S=0 with $m_s$=0. Because recombination conserves angular momentum, capture will only occur for singlet pairs whereas triplet pairs will dissociate after a given amount of time. The process is completed by subsequent electron-hole annihilation. The order of electron or hole capture may be reversed.

In the absence of a magnetic field, the ratio of singlet to triplet pairings within the SiC will maintain a certain rate of recombination. However, the singlet to triplet population ratio can be altered by application of an external magnetic field, which can be detected as a change in the diode's current. To understand how this process occurs, it is possible to first consider the Hamiltonian of the two electron spin system in the presence of neighboring magnetic nuclei immersed in a small external magnetic field directed in the z direction, i.e. $B=B\hat{z}$, $$\mathcal{H} = g\mu_B B \cdot (S_1 + S_2) + \sum_i^2 \sum_j^N S_i \cdot A_{i,j} \cdot I_j + J_0 S_1 \cdot S_2 + S_1 \cdot D \cdot S_2 \quad (1)$$

In Eq. (1), g is a defect specific and (though not necessarily) an orientation dependent constant usually around 2 (assumed here to be the same for defect and charge carrier), $\mu_B$ is the Bohr magneton, $S_1$ and $S_2$ are the spin angular momentum operators of the two spins, $I_j$ are the nuclear spin angular moment operators for the N neighboring nuclei, $A_{i,j}$ the nuclear hyperfine parameters of electron i with nucleus j, $J_0$ is the isotropic exchange constant, and D are the dipolar parameters.

The magnetic isotopes in the SiC system are the host atoms of $^{29}$Si (I=1/2, 4.7% abundant) and $^{13}$C (I=1/2, 1.1% abundant) as well as the p-type dopant atom of $^{27}$Al (I=5/2, 100% abundant). It is assumed for brevity that the hyperfine tensor is axially symmetric, and therefore has diagonalized elements $A_{i,x}$, $A_{i,y}$, and $A_{i,z}$ for i=1, 2.

Figure 6:
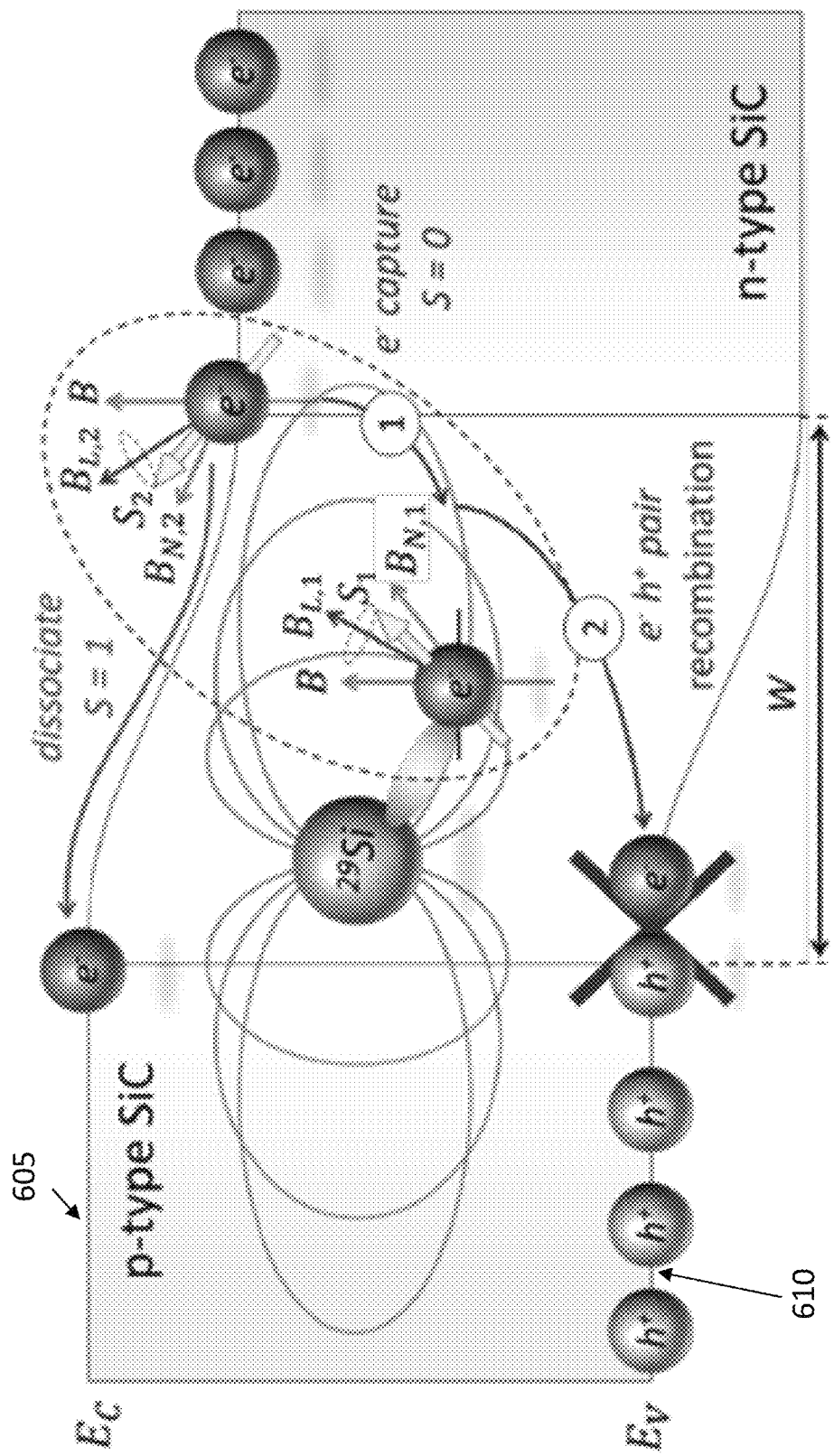
FIG. 6 illustrates a band diagram with the conduction and valence band levels of a pn junction.

It is possible to consider the simplified case of a dangling bond, deep level defect coupled to a $^{29}$Si atom within a forward biased SiC pn junction as illustrated in FIG. 6. FIG. 6 illustrates a band diagram with the conduction (605) and valence (610) band levels across a pn junction. Each electron will experience a slightly different local field $B_{L,1}$ and $B_{L,2}$ due to the differences in position of the two electrons surrounding the magnetic $^{29}$Si nucleus. The local field is the vector sum of the external field B and the nuclear field present at each of the spin sites, $B_{N,1}$ and $B_{N,2}$.

In general, the nuclear fields are related to the hyperfine parameters by $B_{N,i}=\sum_j A_{i,j} \cdot I_{j,i}/g\mu_B$. FIG. 10 illustrates the Hamiltonian matrix elements of the singlet triplet pair in the presence of a single nucleus (N=1). In FIG. 10, the ↑ and ↓ arrows indicate the spin orientation of the spin ½ nucleus. $\Sigma A_x$, $\Sigma A_y$, and $\Sigma A_z$ are the sum of the hyperfine parameters at the two spin sites and $\Delta A_x$, $\Delta A_y$, and $\Delta A_z$ are their differences. Additionally, $D_1=3D_z/2$ and $D_2=(D_x-D_y)$ which naturally evolve from the axial symmetric dipolar matrix D with diagonal values of $D_x$, $D_y$, and $D_z$. As illustrated in FIG. 10, the $\Delta A_x$ and $\Delta A_y$ hyperfine components mix the singlet states with the $T_+$ and $T_-$ states while the $\Delta A_z$ component mixes the singlet state with the $T_0$ state.

The low-field hyperfine mixing alters the ratio of singlet to triplet pairings, thereby allowing changes in recombination current to be measured for changes in external magnetic field. However, because the mixing coefficients are small, only small changes in current (up to a few percent) can be measured in the response. Therefore, frequency and phase synchronous detection is achieved via magnetic field modulation to enhance the sensitivity and signal-to-noise ratio of the measurement. This method restricts the measurement to the axis of modulation and allows for a vectorized measurement to be made. As a result, the responses are typically reported as derivatives which exhibit a sharp zero crossing that is approximately linear through zero magnetic field.

As the magnetic field is increased, the mixing is suppressed by the Zeeman energy splitting. However, by exposing the spin system to electromagnetic (EM) radiation with energy equal to the splitting of the defect levels, it is possible to measure a change in recombination current due to the modified populations of singlet and triplet states that occurs. This method is more commonly known as EDMR. The EM radiation provides a source of angular momentum to the spin pair, thereby allowing the electrons to change state (or flip spin) if angular momentum is conserved and the resonance condition is satisfied, that being when $h\nu=\Delta m_s g\mu_B B$. It can be noted that resonance also occurs at magnetic fields corresponding to $B\pm B_N$ for a nucleus with I=1/2 such as $^{29}$Si, $^{13}$C, or $^{1}$H.

Figure 7:
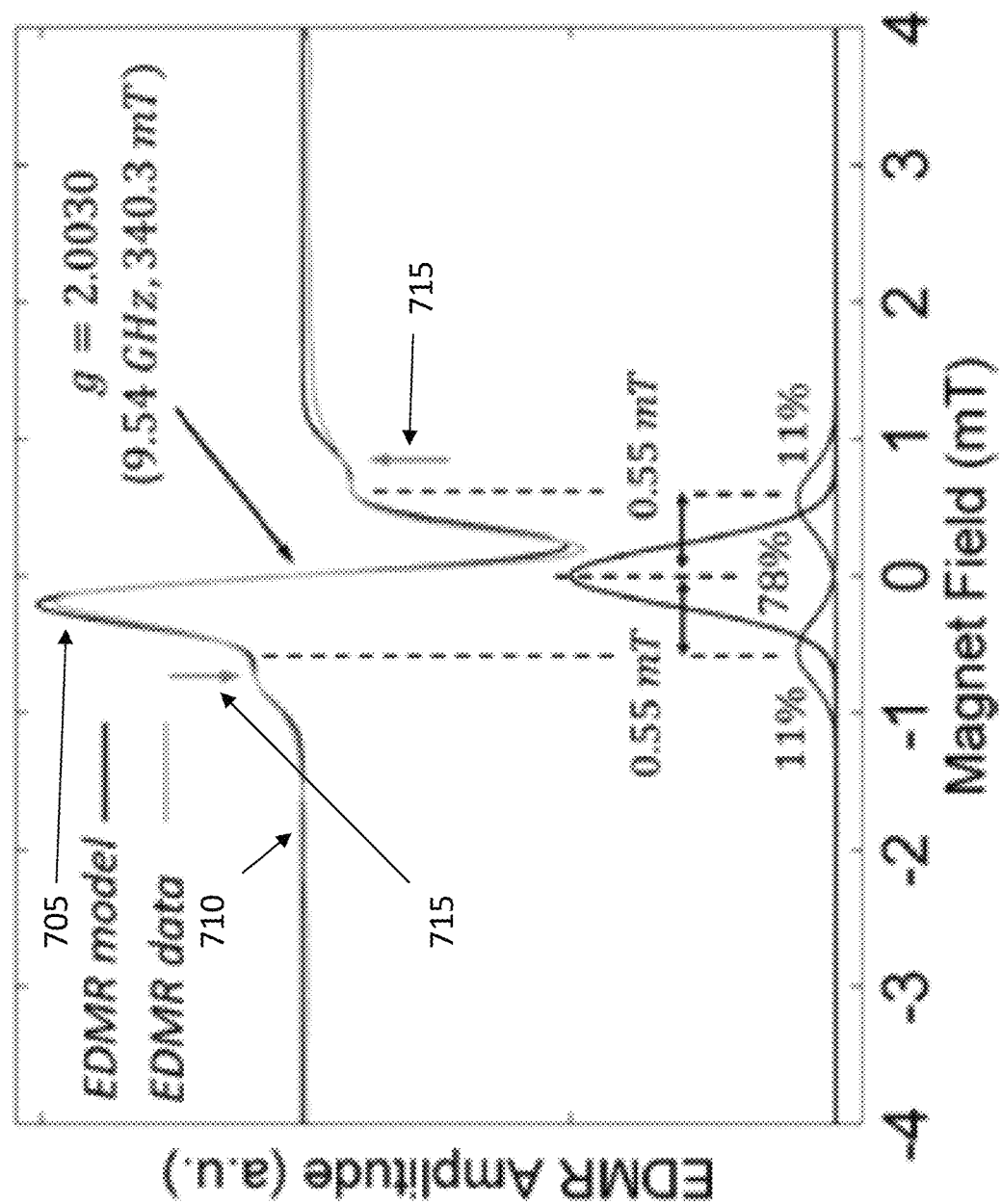
FIG. 7 illustrates a SDR response, acquired via high-field EDMR.

Triplet pairs are able to be converted to singlet pairs, thereby increasing the rate of recombination current and hence, depending on the circumstances, either increasing or decreasing the resistance of the junction. The change in resistance (or recombination) can be detected electrically. FIG. 7 illustrates the SDR response, acquired via high-field EDMR (B=340.3 mT, ν=9.54 GHz), of an exemplary device according to the present disclosure. The measurement reveals that the dominant defect is a silicon vacancy variant. A previous EDMR study acquired from a nearly identical device directly linked the dominant defect spectrum to that of a negatively charged silicon vacancy.

With the crystalline c-axis of the SiC aligned with the external magnetic field, the acquired spectrum consists of a very strong dominating central line (96% of total spectrum), with two very small, almost negligible, sets of side peaks (1.5% and 0.5% of the central line) due to the 1.1% magnetic abundance of $^{13}$C. The strong electron-nuclear hyperfine side peaks that are apparent in the spectrum can be attributed to the almost 100% magnetic abundant spin $m_I=\pm 1/2$ $^{1}$H atom (1.1 mT splitting) which is present near the SiC/SiO$_2$ interface. The defect is isotropic as the acquired spectra are nearly identical when the crystalline c-axis is rotated about three axes. Therefore, as illustrated in FIG. 7, the response can be modeled with a strong dominating central line (78% of the total spectrum) with two side peaks (each contributing 11% to the defect spectrum) equally spaced 0.55 mT from the central line. All three peaks in the model are generated from a Gaussian distribution with standard deviation σ=0.05 mT. The peaks are summed and the derivative is taken to mimic the effect of magnetic field modulation. As illustrated in FIG. 7, there is very good agreement between the model (705) and the EDMR data (710).

Figure 8:
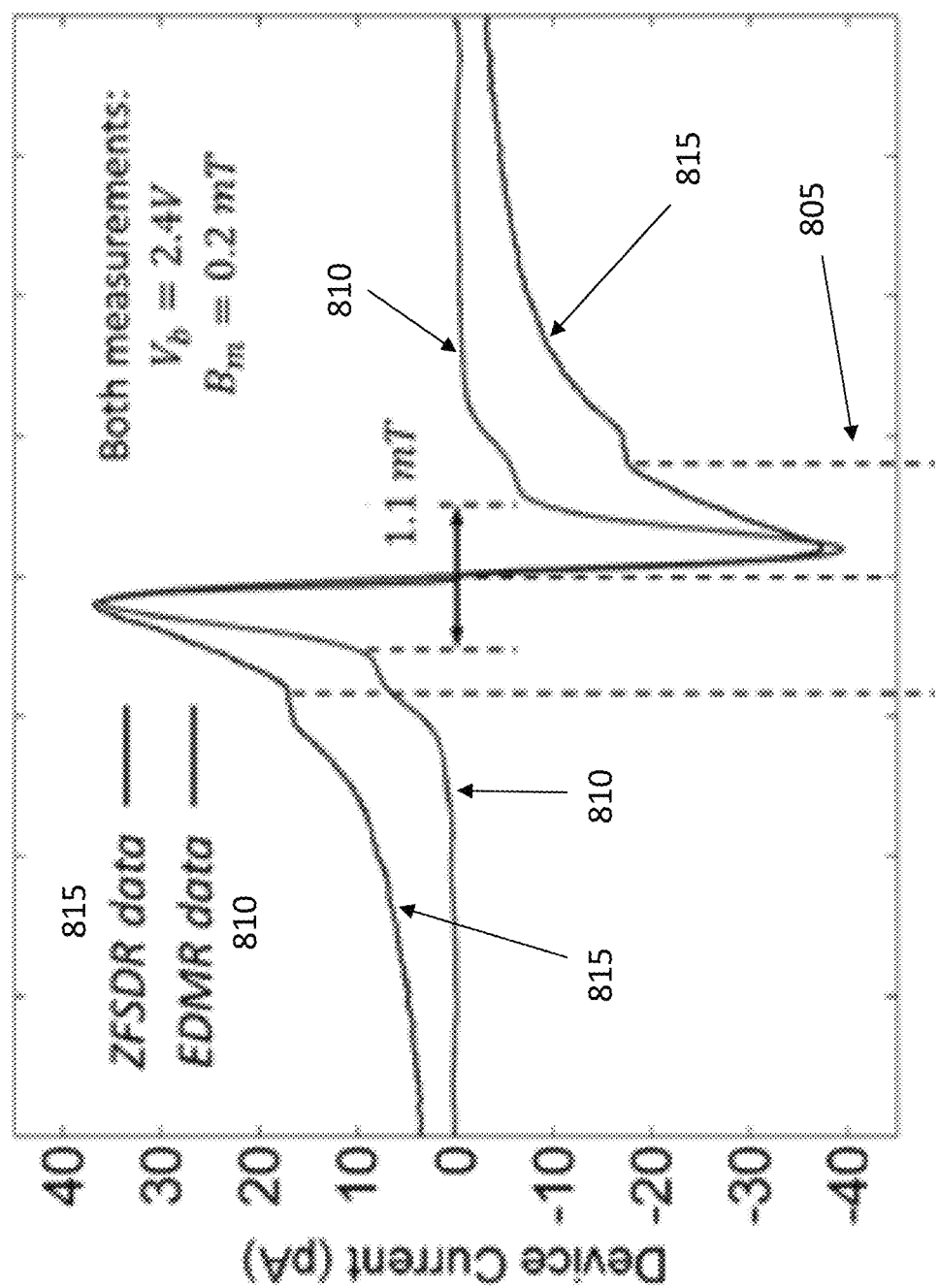
FIG. 8 illustrates a comparison of the high-field EDMR and the ZFSDR magnetoresistive responses.

FIG. 8 illustrates a comparison of the high-field EDMR (810) and the ZFSDR (815) magnetoresistive responses acquired from the same exemplary device of FIG. 7, biased with the same potential. Even though the ZFSDR spectrum appears broader, it has a very similar zero-crossing slope compared to that of the high-field response. This makes the ZFSDR response an excellent technique for sensing near-zero magnetic fields (|B|<0.1 mT). Remarkably, the hyperfine side peaks are retained in this measurement. By inspection of the eigenvalues of the Hamiltonian matrix evaluated at different magnetic fields using the isotropic defect hyperfine parameters obtained in the high-field EDMR model ($A_{1,(x,y,z)}$ $m_I/g\mu_B$=0.55 mT) and that of a conduction electron located twice as far away ($A_{2,(x,y,z)}$ $m_I/g\mu_B$=0.55/$2^3$ mT), it is apparent from FIG. 8 that, not only do the singlet and triplet pairs mix precisely at zero magnetic field (between the $|T_+, \downarrow\rangle$ and $|S_0, \uparrow\rangle$ states), but there is also a singlet-triplet intersystem crossing at B=±0.825 mT which exactly corresponds to the location of the electron-nuclear hyperfine peaks observed in the ZFSDR spectrum.

Because the hyperfine interactions are isotropic, it is precisely the mixing between the $|T_-, \uparrow\rangle$ and $|S_0, \downarrow\rangle$ states which allows the satellite peaks to be measured due to the preservation of the $\Delta A_x + \Delta A_y$ matrix elements. It can be noted that the $\Delta A_x - \Delta A_y$ and $\Delta A_y - \Delta A_x$ elements cancel for isotropic defects. In general, depending upon the strength and number of the hyperfine interactions, multiple satellite peaks may be detected in the ZFSDR response at fields relating to the hyperfine parameters themselves. This is clearly evident in more complicated defects as those reported in 4H—SiC BJTs. Also, depending on the proximity of the two electron spins, dipolar and or exchange interactions may cause a split peak to present at zero magnetic field, due to the singlet-triplet degeneracy removal that occurs from this interaction. These features are depicted in some of the spectra illustrated elsewhere in the present disclosure.

Figure 9:
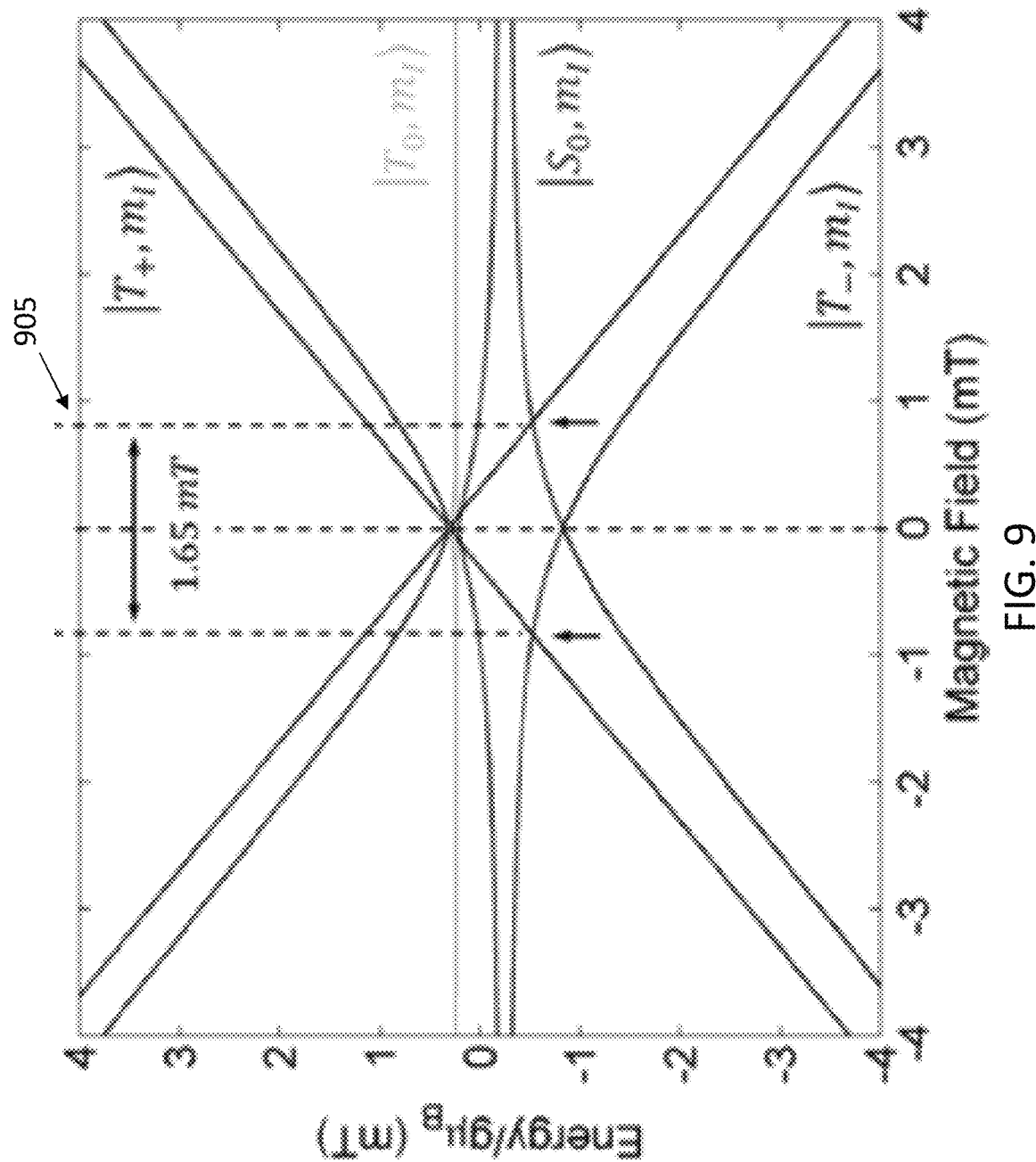
FIG. 9 illustrates energy levels of the spin Hamiltonian matrix.

FIG. 6 illustrates a conceptualized illustration of SDR in a pn junction where singlet-triplet pairs form in the presence of a nuclear magnetic field $B_N$ and a small external magnetic field B. The local field $B_L$ experienced by each electron is the vector sum of both of these field components. Conduction electrons will couple with unpaired defect electrons for a finite amount of timec forming either triplet or singlet states. Because the capture event, leading to eventual recombination, involves zero change in angular momentum, only singlet pairs will lead to recombination whereas triplet pairs dissociate. Because triplet pairs exist for a finite amount of time, radiative (magnetic resonance) or non-radiative transitions from triplet pairs to singlet pairs may occur which can increase the capture rate and thus the recombination rate. The latter occurs due to the mixing of states that results from the spin sites having slightly different local fieldsm as can be seen from FIG. 10. FIG. 7 illustrates a comparison of the SDR response acquired via high-field EDMR ($B_0$=340.3 mT, v=9.54 GHz, $B_m$=0.2 mT) and the corresponding model. It can be noted that the equally spaced satellite peaks, indicated by the vertical arrows (715) spaced 1.1 mT apart, are consistent with a doublet involving hydrogen. FIG. 8 illustrates a comparison of the high-field EDMR and ZFSDR responses when biased with 2.4 V. FIG. 9 illustrates energy levels of the spin Hamiltonian matrix, given by FIG. 10, evaluated over a small range of magnetic fields using hyperfine parameters obtained from the high-field EDMR model. It can be noted that the hyperfine peaks illustrated in the ZFSDR response are precisely located at magnetic fields which correspond to crossing of singlet and triplet energy levels. The dashed lines in FIG. 8 (805) correspond to the dashed lines in FIG. 9 (905).

The magnetometers of the present disclosure rely on a magnetic field modulation scheme. Therefore, the sensitivity of the instrument can be defined by the zero crossing slope of the response and the noise retained in the bandwidth of interest of the modulation frequency used. The quantity of interest is the local derivative at the zero crossing center line, therefore a Gaussian line shape can be assumed:

$$I(B) = \frac{\Delta I}{\sigma\sqrt{2\pi}}\exp^{-B^2/2\sigma} \quad (A/T) \qquad (2)$$

Figure 11:
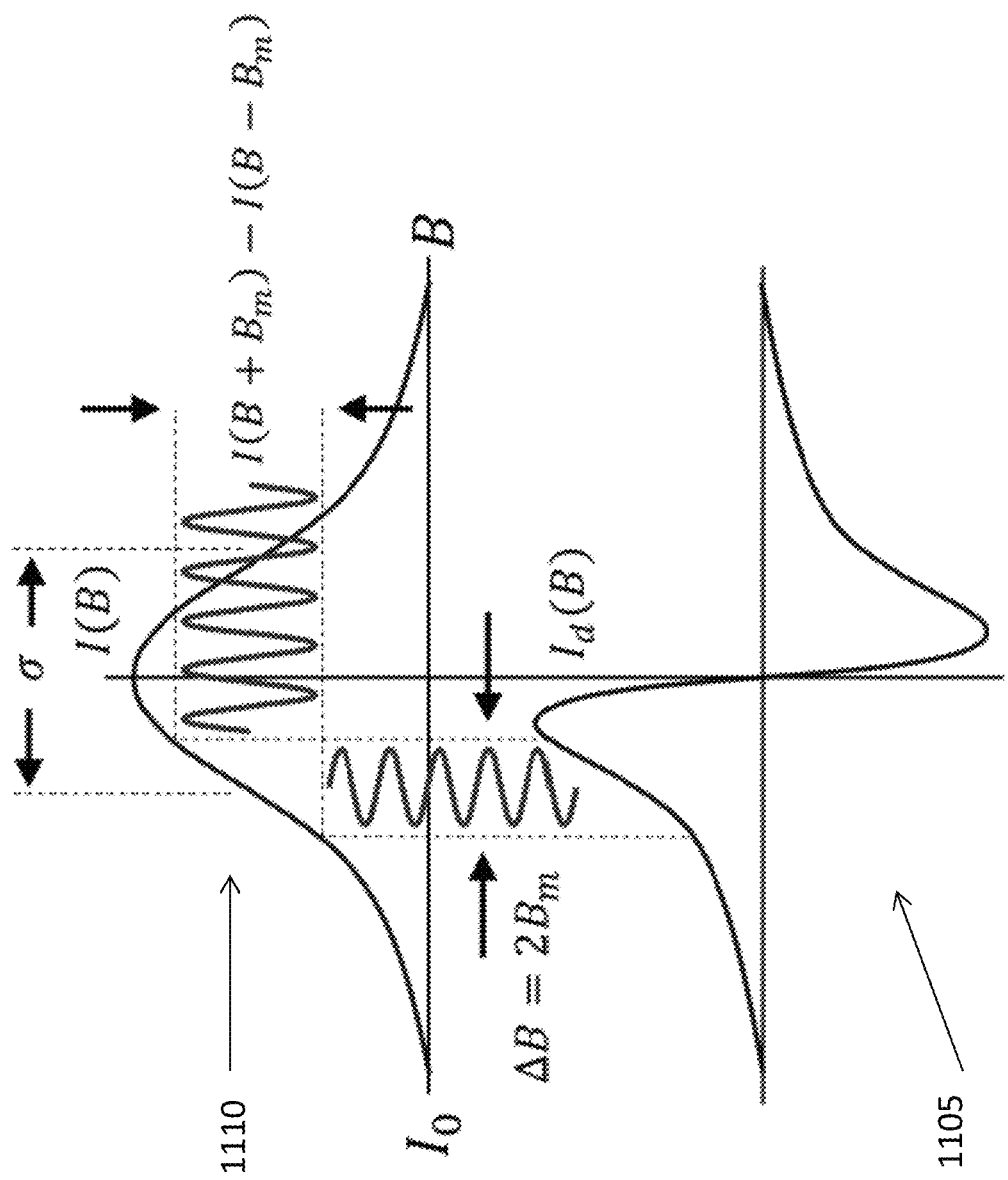
FIG. 11 illustrates a magnetic field modulation scheme.

Here, $\sigma$ is the width (standard deviation) of the underlying response in units of Tesla, $\Delta I$ is the change in current in Ampere, and B is the magnetic field in Tesla where the current is maximum at B=0 nT. Magnetic field modulation will induce a series of harmonics in the measured response. The fundamental will have an envelope that is proportional to the responses derivative if the modulation amplitude $B_m$ is relatively small. This concept is illustrated in FIG. 11. The measured data resulting from demodulating the fundamental is, $$I_d(B) \cong \frac{dI(B)}{dB}B_m \quad (A/T) \qquad (3)$$

The uncertainty, or sensitivity, in the magnetic field $\delta B$ is related to the uncertainty in the measured current response $\delta I_d$ by, $$\delta I_d(B) = \delta B \left| \frac{dI_d(B)}{dB} \right|_{B=0} = B_m^2 \delta B \frac{\Delta I}{\sigma^3 \sqrt{2\pi}} \quad (A) \qquad (4)$$

Additionally, the field modulation scheme allows for a measurement to be made that is shot noise limited (far from the flicker noise elbow). Therefore, the uncertainty in current response $\delta I_d$ is related to shot noise by $\delta I_d = I_{shot} = \sqrt{2qI_0\Delta f}$, where q is the electronic charge, $I_0$ is the DC current which is responsible for the flicker noise, and $\Delta f$ is the bandwidth of the measurement which is related to the time constant $\tau$ of the low pass filter that follows the mixer in the demodulator, $\Delta f=1/2\pi\tau$. Setting Eq. 4 equal to the shot noise and assuming $B_m=\sigma$, rearranging yields the sensitivity of the instrument, $$\frac{\delta B}{\sqrt{\Delta f}} = 2\sigma\sqrt{\pi q}\frac{\sqrt{I_0}}{\Delta I}(T/\sqrt{Hz}) \qquad (5)$$

The same relation was used to calculate sensitivity limits by for an EDMR based magnetometer (as in Ref. [3]). The change in current $\Delta I$ at B=0 mT was extracted from the measured data by numerical integration. Integration was performed $I(B[i])=I_d(B[i])/(F_sB_m)+I(B[i-1])$ for i=1:M, where i is the index of the array, M is the number of samples in the spectrum, and $F_s$ is the sample rate in units of samples per unit magnetic field.

Figure 12:
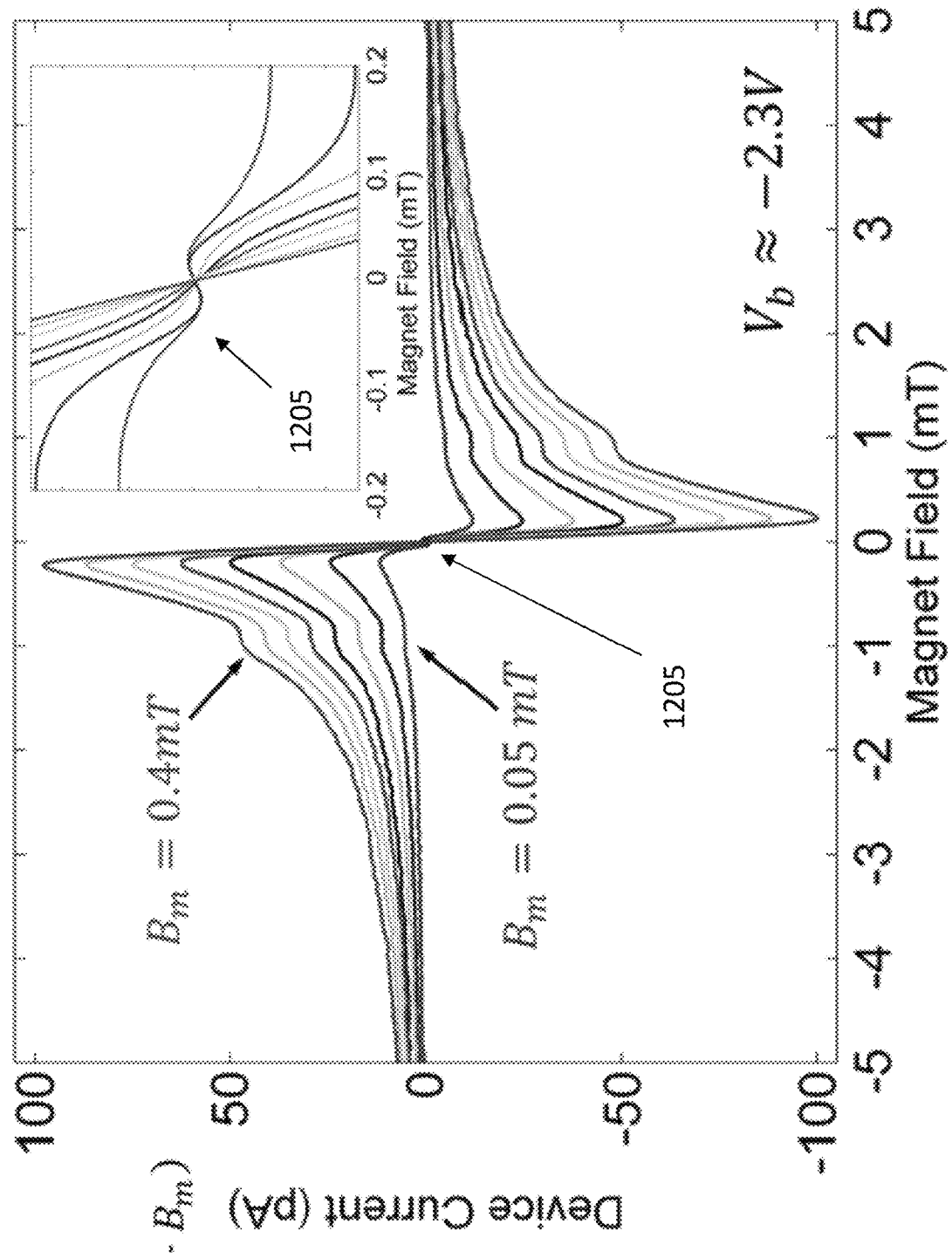
FIG. 12 illustrates raw data obtained using a forward junction bias of 2.3 V at various modulation amplitudes.

FIG. 12 illustrates the raw spectra acquired at various modulation amplitudes with a forward junction bias of 2.3 V. The peak-to-peak amplitude of the measured data grows with increasing modulation amplitude as it represents dI(B) rather than dI(B)/dB. The relative sharpness of the spectrum is attributed to the presence of a dominant defect, a silicon vacancy variant, within the ordered crystalline environment of the SiC semiconductor. The magnetoresistive response within the 4H—SiC lattice will therefore naturally have a sharper response (<0.3 mT in this case) than that observed in amorphous materials such as organic semiconductors and/or dielectric tunneling junctions.

Figure 13:
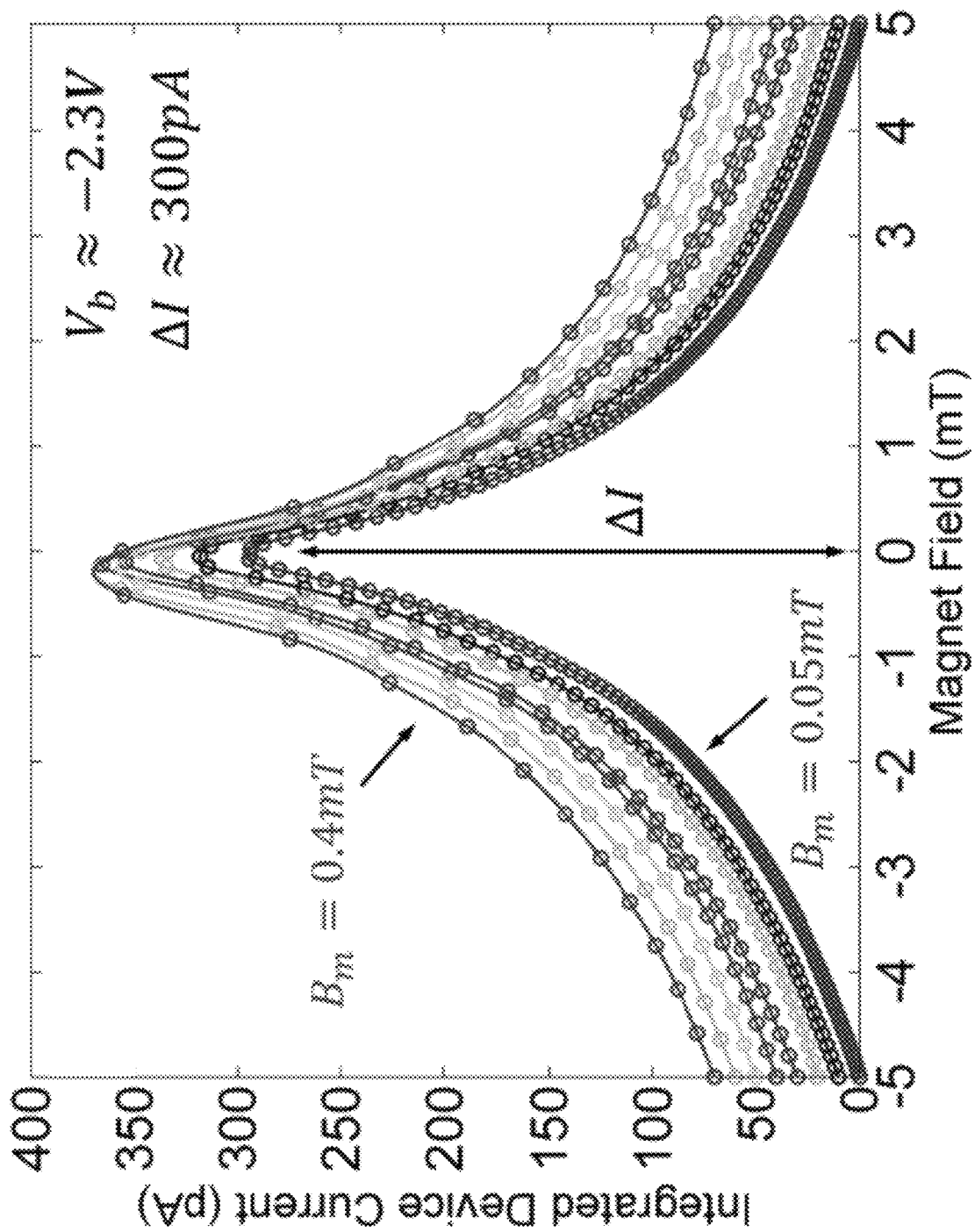
FIG. 13 illustrates integrated data of the spectra illustrated in FIG. 12, each offset by 10 pA of current for clarity.

As described above in the present disclosure, the crystalline nature of the semiconductor allows for the detection of the electron-nuclear hyperfine interactions which are depicted by the inflections spaced 1.65 mT apart, symmetric about zero magnetic field. Additionally, as described earlier, the narrow notch located precisely at zero magnetic field (1205) can be attributed to spin-spin interactions of the defect electron and can only be resolved when leveraging a low amplitude modulation waveform and an elevated junction bias. Its presence can therefore be turned on or off and leveraged for self-calibration, a method described in more detail below in the present disclosure. FIG. 13 illustrates the integrated responses of the spectra depicted in FIG. 12, each offset by 10 pA for clarity. It can be noted that, as expected, the change in current ΔI at B=0 mT in the integrated spectra are all the same for different modulation amplitudes.

FIG. 11 illustrates a magnetic field modulation scheme illustrating the relationship between the line shape of the raw data (1105) to the actual response (1110). FIG. 12 illustrates raw data obtained using a forward junction bias of 2.3 V at various modulation amplitudes. FIG. 12 (1205) illustrates the effect of increased applied junction bias, which causes a split peak about 0 mT to be observed in the measured response. FIG. 13 illustrates integrated data of the spectra illustrated in FIG. 12, each offset by 10 pA of current for clarity.

Figure 14:
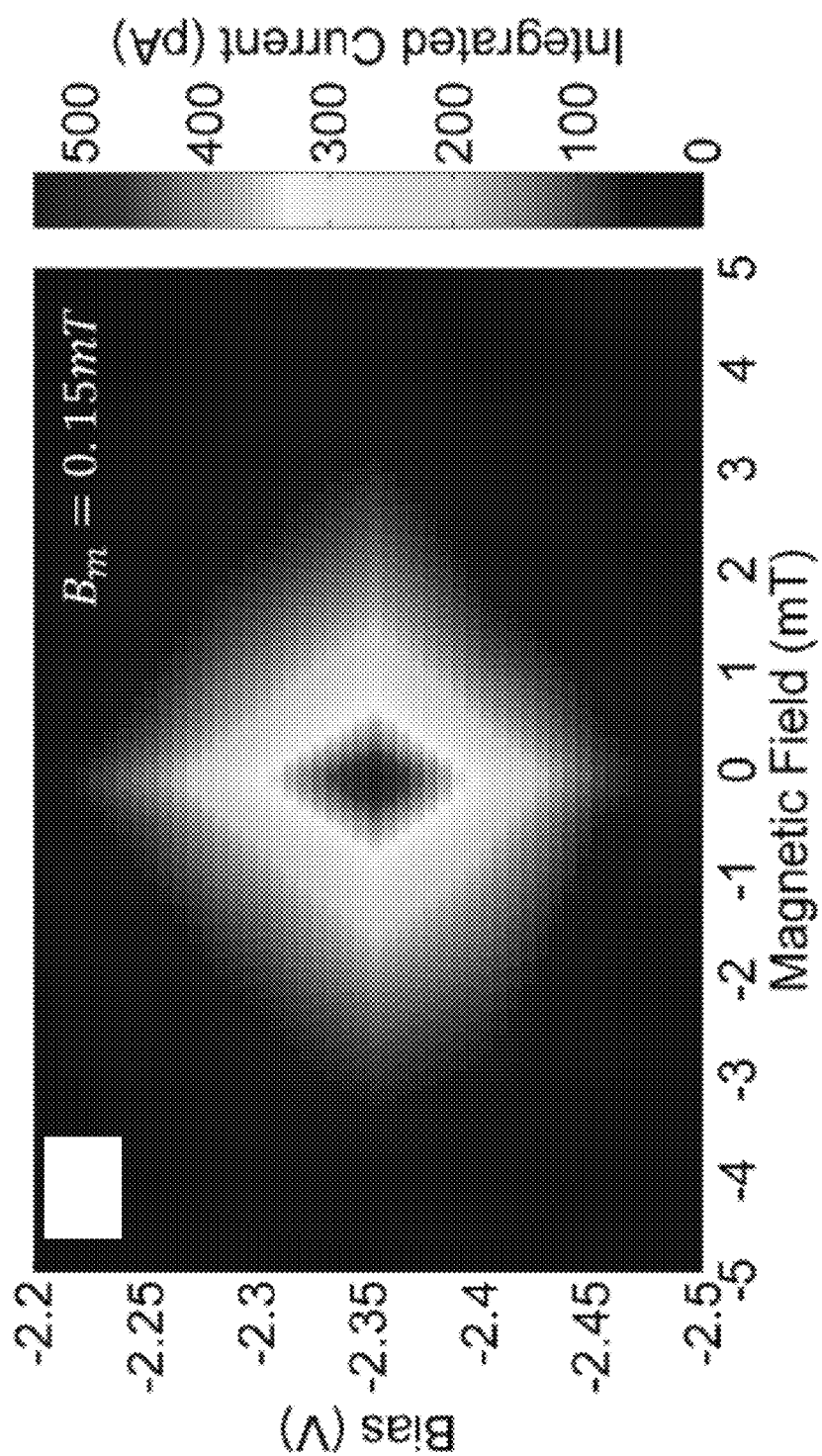
FIG. 14 illustrates the change in current $\Delta I$ as a function of applied magnetic field and junction bias.
Figure 15:
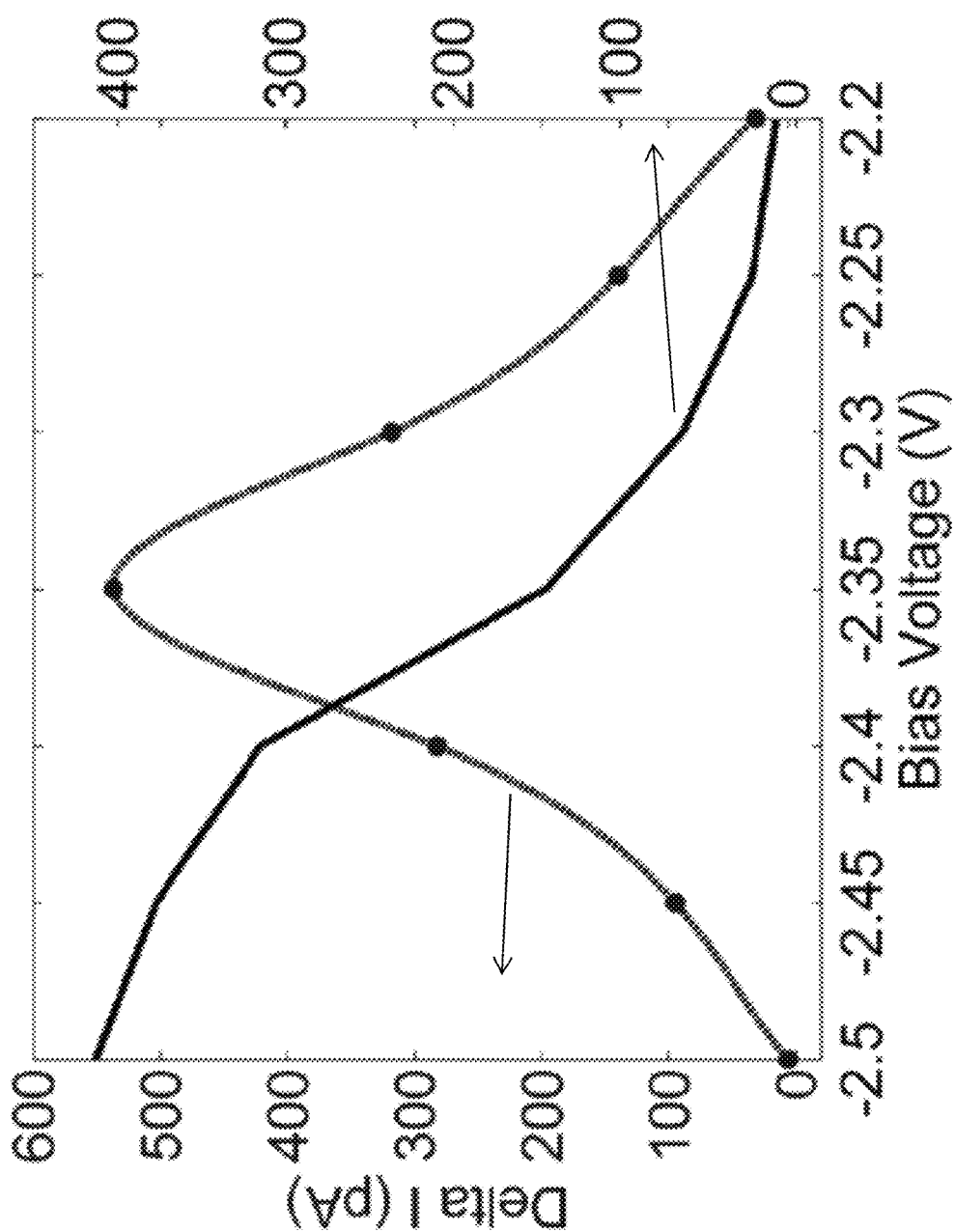
FIG. 15 illustrates the change in current $\Delta I$ at B=0 mT and DC current $I_0$.
Figure 16:
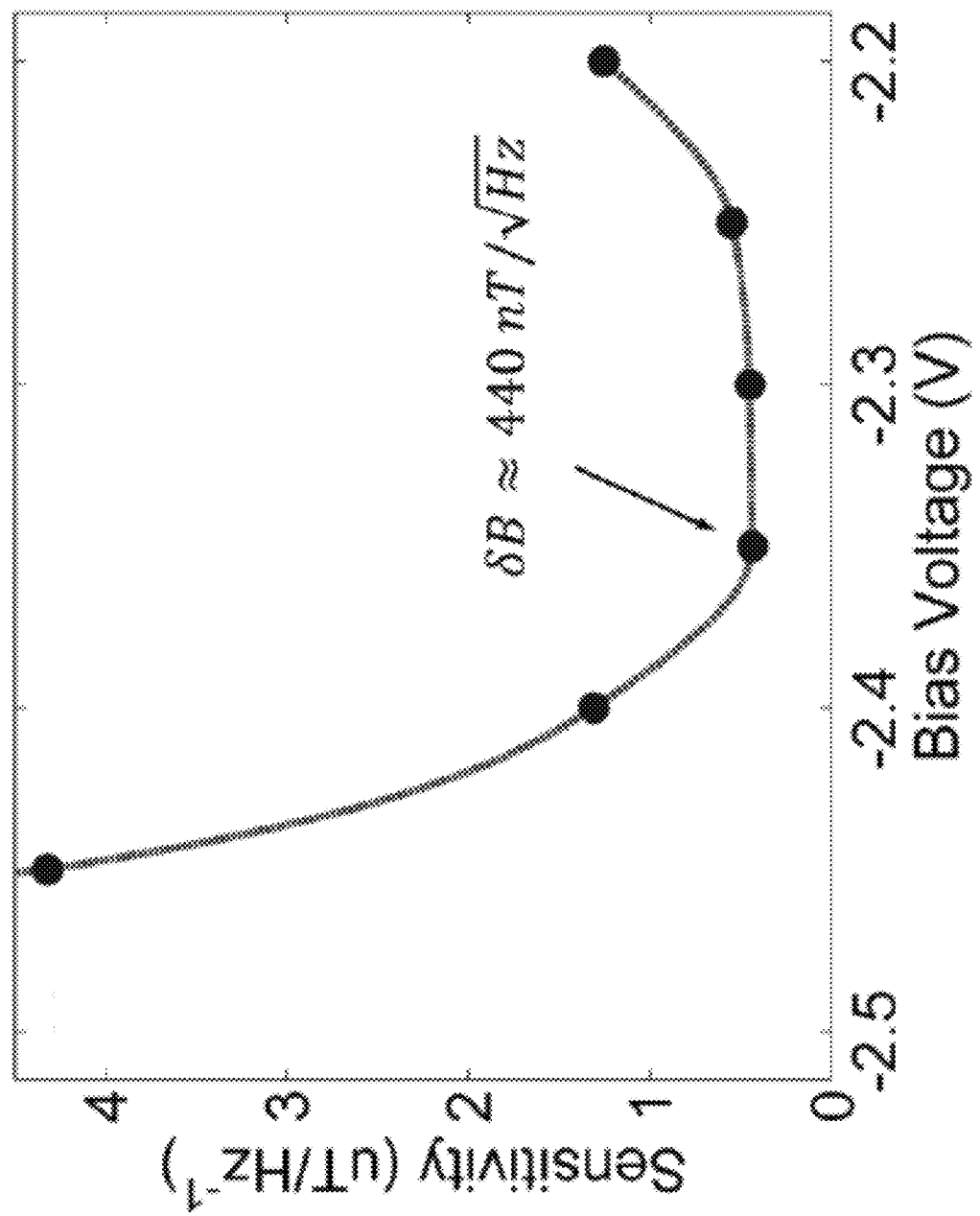
FIG. 16 illustrates the sensitivity $\delta B$ as a function of applied junction bias.

The junction bias was varied to find the optimal tradeoff between signal amplitude and device noise, and hence, sensitivity. FIG. 14 illustrates a series of measurements made over a 1 Hz ($\tau=1/2\pi$) bandwidth at different junction biases. As illustrated in FIGS. 15-16, the maximum change in current (ΔI/I=0.37%) was extracted from the integrated data to yield an approximate sensitivity of 440 nT/√Hz when a forward bias of 2.35 V was applied to the junction. The sensitivity reported here is sufficient for a magnetic field sensor on the surface of Earth ($B_{Earth} \approx 30{,}000$ nT), however, in other embodiments, the sensors of the present disclosure can have a greatly increased sensitivity, suitable for space missions.

FIG. 14 illustrates the change in current ΔI as a function of applied magnetic field and junction bias. FIG. 15 illustrates the change in current ΔI at B=0 mT and DC current $I_0$ and FIG. 16 illustrates the sensitivity δB as a function of applied junction bias. It can be noted that for this exemplary SiC device, a forward bias of 2.35 V yielded the optimum sensitivity of δB=440 nT/√Hz.

The magnetometer described in the present disclosure is based on a magnetic field cancellation scheme that maximizes the ZFSDR current in the pn junction by maintaining a local region of zero-magnetic field across the volume of the device. The device can be housed within three sets of Helmholtz coils (one for each dimension) that are driven independently to provide a low-frequency (<50 Hz) cancellation field and a modulation field at audio frequencies. As the low-frequency driving current in these Helmholtz coils is directly proportional to the magnetic field it generates, its measure will serve as an indirect measure of the field being cancelled in each dimension. An exemplary block diagram of the magnetometer is illustrated in FIG. 17.

Figure 17:
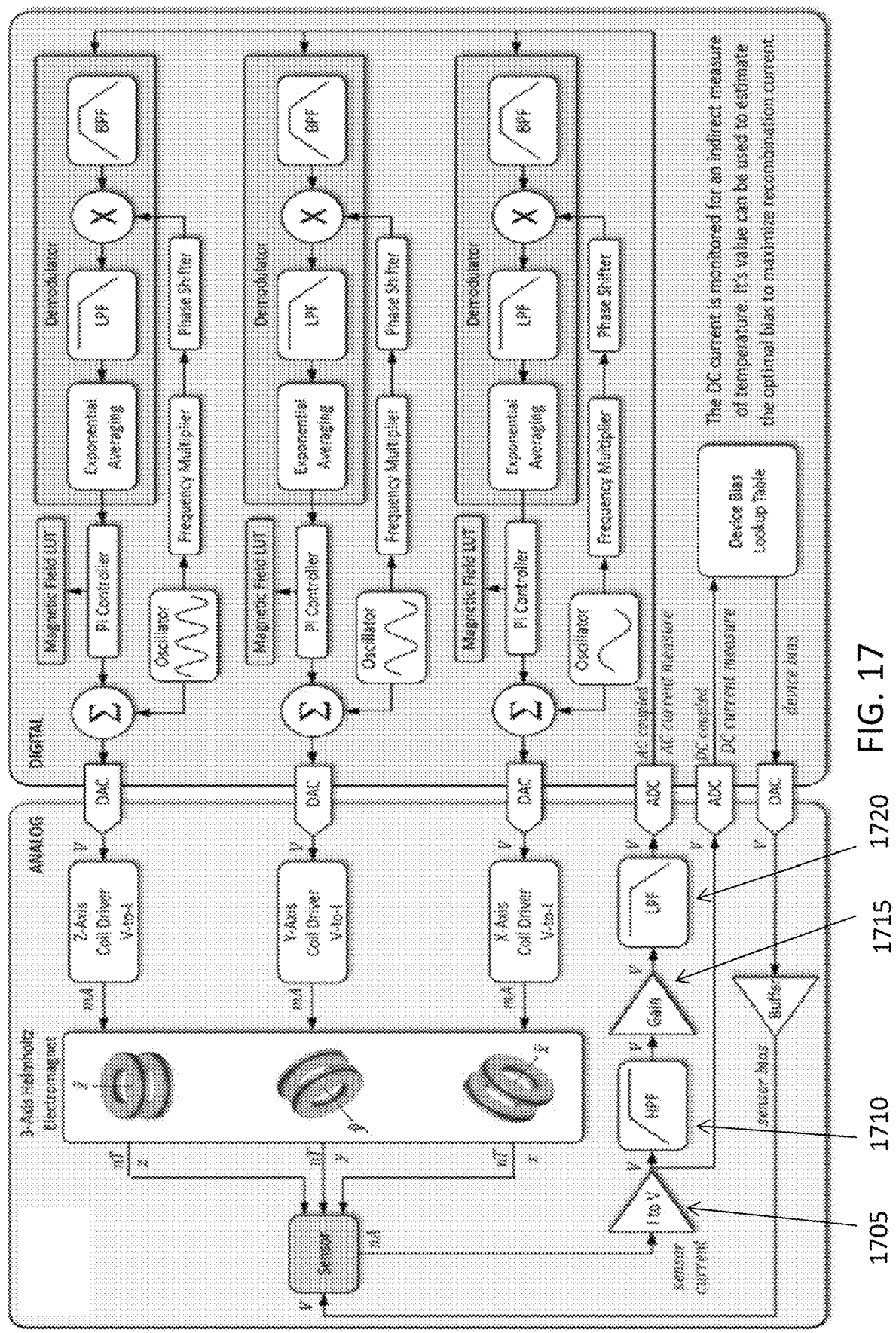
FIG. 17 illustrates an exemplary block diagram of a magnetometer.
Figure 18:
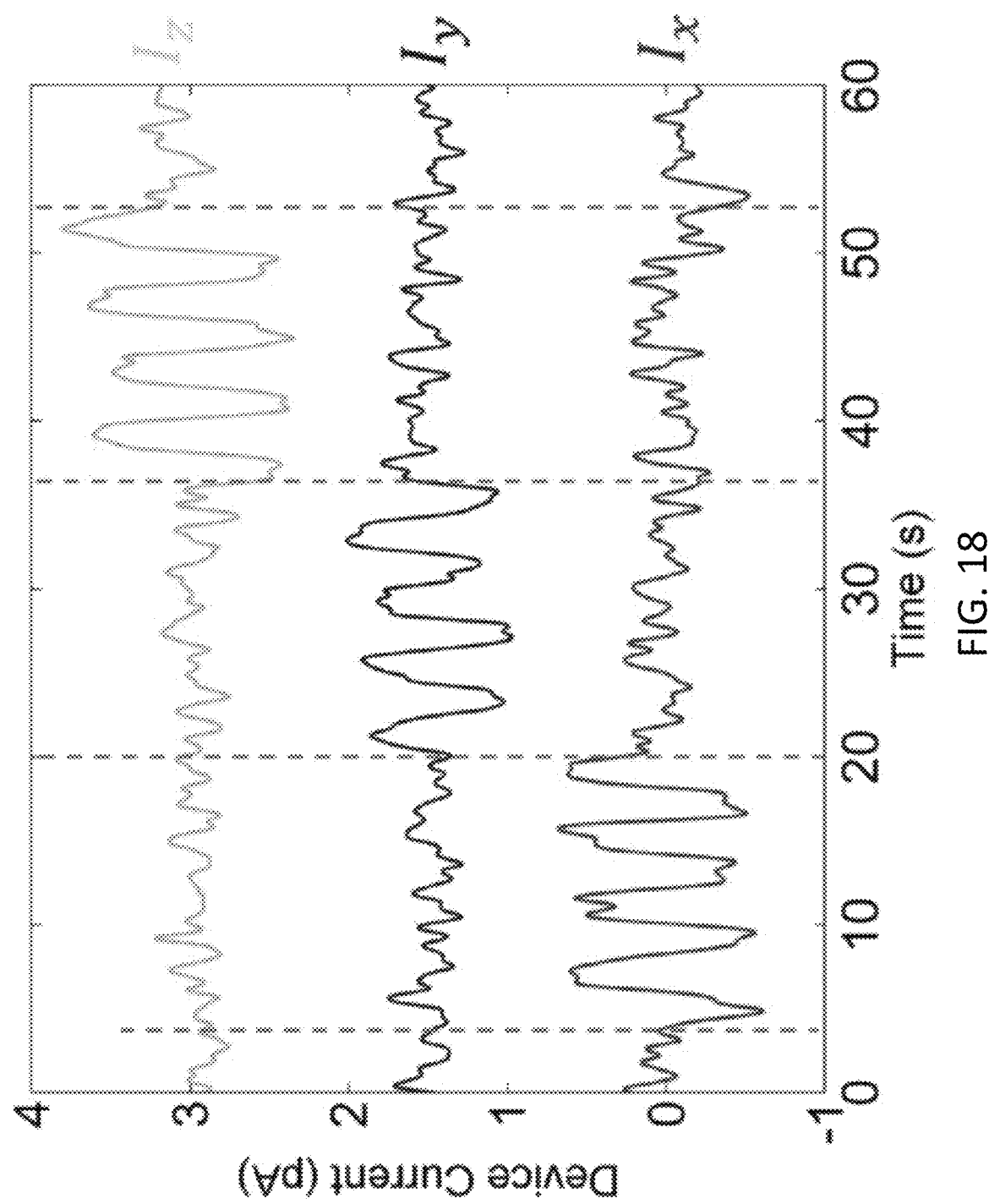
FIG. 18 illustrates data taken from a magnetometer.

As illustrated in FIG. 17, the change in SDR current of the SiC sensor is induced by the magnetic field. The SDR current is first fed through a high gain transimpedance amplifier with AC coupling before it is digitized for optimum sensitivity. The amplified DC current can also be digitized in order to extract a crude measure of temperature. This will allow the instrument to optimally bias the SiC sensor for maximum recombination for any changes in temperature that may occur. The conditioned AC signal is then digitized and fed into three independent (one for each axis), user-configurable digital demodulators operating at different frequency bands. This allows for the three vectorized magnetic field components to be frequency division multiplexed onto a single channel. The demodulator involves an optional first stage of digital bandpass filtering, and then is followed by a mixer that performs a point-by-point multiplication of the incoming signal with a time-synchronized, user-configured (demodulating harmonic and demodulating phase) sinusoid. This operation allows measurement of the signal strength at any particular harmonic of the fundamental modulation frequency. A low-pass filter is used to remove the high-frequency mixing artifact, and an exponential averaging block is used to further reduce noise on the remaining signal based upon the user-configured bandwidth. A digital-based PI controller is implemented for each of the three demodulators for tracking the zero crossing center line of each current component. The error output of each controller is added to its corresponding modulation waveform in software prior to digital-to-analog conversion. This error is proportional to the magnetic field in each axis, and hence, is the current required to be passed through each Helmholtz coil in order to maintain a local region of zero magnetic field. In order to test the δB=440 nT/√Hz sensitivity metric, the current for each axis was recorded in the presence of an alternating axis, square wave magnetic field of amplitude of ±1500 nT within a mu-metal shielded chamber. As illustrated in FIG. 18, the device can simultaneously measure these weak magnetic field signatures using a single sensor. FIG. 18 illustrates measurement of three current components versus time, each offset by 1.5 pA for clarity, in the presence of an alternating axis, ±1500 nT square wave magnetic field.

Figure 19:
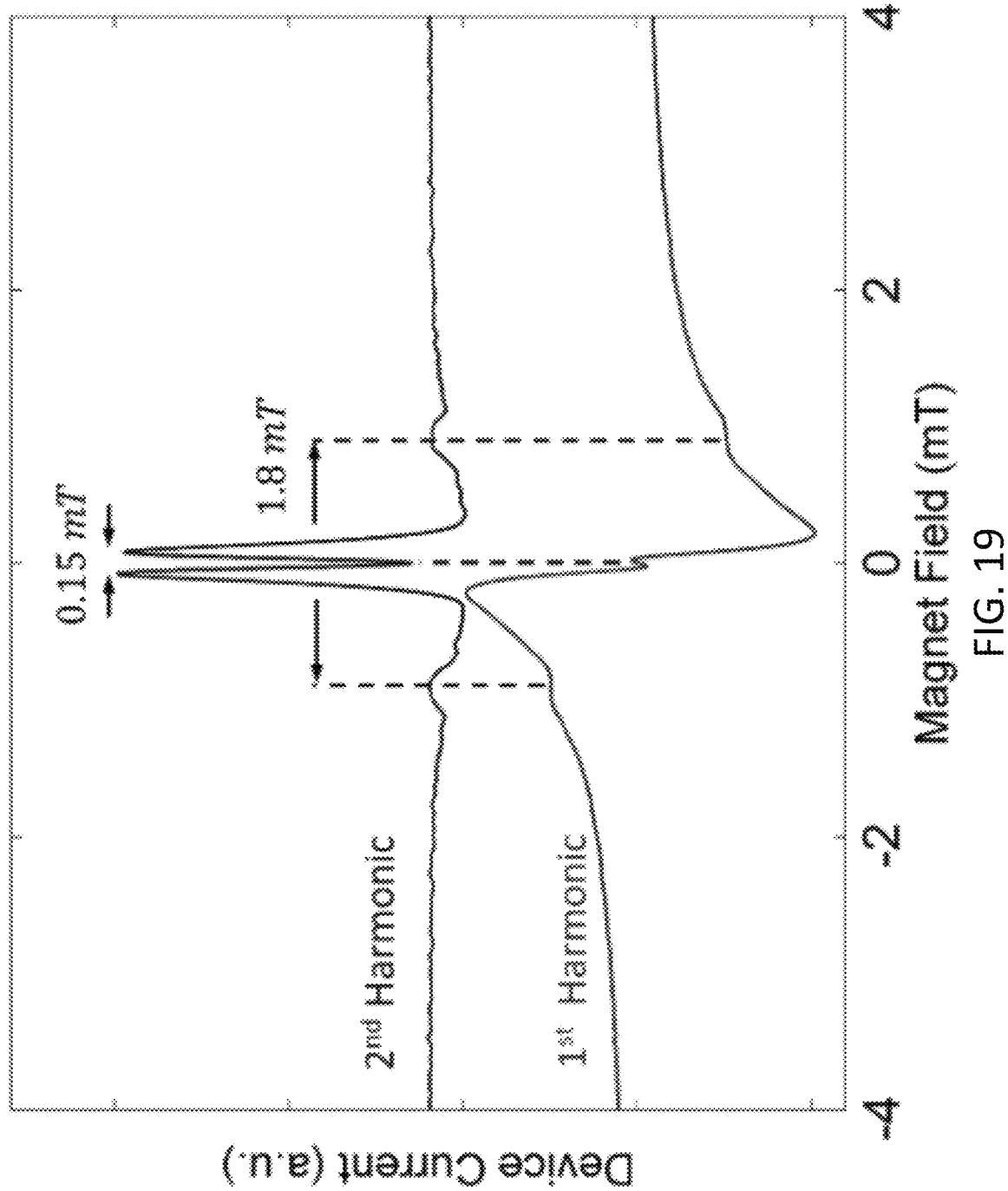
FIGS. 19-20 illustrate exemplary self-calibration data.
Figure 20:
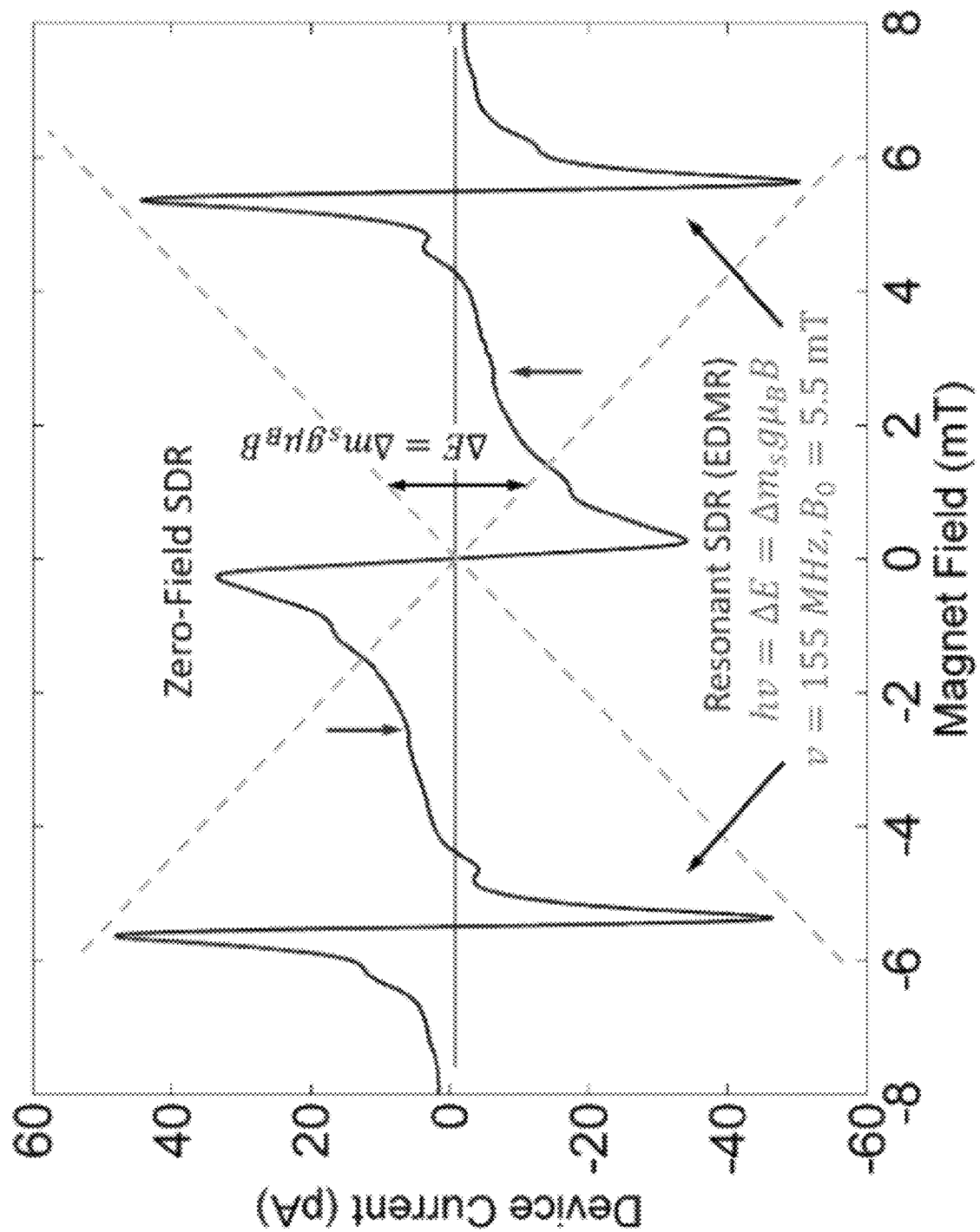

An important concern with regard to magnetometers, and scientific instruments on board satellites and landers in general, is remote calibration. The sensors of the present disclosure, which can be referred to as "SiCMag", have the ability to self-calibrate, a significant advantage. SiCMag has two forms of self-calibration, both of which are illustrated in FIGS. 19-20.

Calibration of any magnetometer has three calibration parameters: offset, scale-factors, and misalignments. Two ways to obtain these parameters are described in the following. The first and simpler self-calibration method entails leveraging the electron spin interactions that are observed in the ZFSDR spectrum. FIG. 19 illustrates the $1^{st}$ and $2^{nd}$ harmonic spectra which clearly demonstrate the detection of the electron spin interactions discussed above in the present disclosure. Because these interactions are virtually independent of temperature and also very stable over long periods of time, their spacings will be maintained with extraordinary stability. It is known to the person of ordinary skill in the art that the spacing of the narrow split peak observed in organic semiconductors remains constant from room temperature down to a temperature of 10 K.

By measuring the spacing of these magnetic field indicators as a function of the applied coil current, it is possible to extract a constant-of-proportionality measure that can be used to calibrate the coil-driving system. This self-calibration mode can be turned on or off with the bias junction voltage and/or modulation amplitude as was shown above in the present disclosure. The modulation amplitude essentially controls the minimum detectable feature size while the bias voltage not only controls sensitivity, but also controls the strength of the coupling between the two electrons spins. It should be noted that each axis will need to be calibrated independently to account for not only defect anisotropy but also due to differences in coil size and non-ideal characteristics of the electronics that drive each axis.

In this first method, a linear ramping current (negative to positive through zero current) is fed to one axis of the coil system. The ramping current produces a linearly swept magnetic field (negative to positive through zero magnetic field) and measures the current from the sensor. The spacing of the hyperfine peaks is then measure as a function of coil current. Because the spacing of the hyperfine peaks as a function magnetic field will be known (as they are physical constants in nature) the constant of proportionality relating the coil current to the magnetic field can be calculated, by simply dividing these spacing quantities. In this way, it is possible to obtain the scale factor calibration parameter for the axis being measured. After applying the constant of proportionality to the data set, the zero-crossing is taken as the offset calibration parameter for that particular axis. This process is repeated for the remaining two axes to obtain the offsets and scale factors for those axes.

The second method of calibration entails performing low-field EDMR on the same device as illustrated in FIG. 20. This method is advantageous because the measurement itself becomes a form of absolute magnetometry, and can be used to validate the measured ZFSDR response. The method can be accommodated by incorporating a miniature low-frequency RF excitation source, which drives a small loop coil or strip line resonator on the printed circuit board (PCB) to provide the oscillating magnetic field required to drive the spin system into resonance.

Alternatively, the three-axis coil system also allows for self-calibration using EDMR. One set of coils can be used to generate a constant polarizing magnetic field while the other two sets of coils can be used to generate a rotating magnetic field in the plane perpendicular to the constant field at a frequency which corresponds to resonance of electrons within the defect. The rotating field is frequency modulated and allows for an absolute scalar magnetic field measurement to be made. This scalar measurement can then be used to calibrate the vectorized measurements, thereby extracting the offsets, scale factors, and non-orthogonality of each axis using a least-squares estimator. Depending on the energy splitting of the defects utilized and the strength of the field in which the sensor is immersed, the carrier frequency of the rotating magnetic field can range anywhere from 3 kHz to 1.4 MHz, corresponding to electron spin resonances in fields of 100 nT to 50,000 nT, respectively.

The additional magnetic field measurement provides important redundancy in the remote environment of space. It should be noted that, in some embodiments, this method is not used when operating in a high energy radiation environment for prolonged periods of time. If the radiation induces a significant number of defects (with different g factors) due to prolonged exposure, the EPR condition of the defect electron outlined earlier may change. This adds uncertainty to the precise field/frequency relationship of the EPR condition, thereby making the measurement unreliable.

However, the wide bandgap of the SiC semiconductor should ensure that measurement altering defects are not created, or at least not in a quantity that overwhelms the original defect spectrum. It should be noted that even if different defects are created in these harsh environments, it will not affect the magnetoresistive response associated with the device because the ZFSDR response is insensitive to defects with different g values. Thus, the accuracy of the measurement is preserved. However, the linewidth may be slightly compromised which results in a slight loss in sensitivity.

FIGS. 19-20 illustrate self-calibration modes of SiCMag. FIG. 19 illustrates how the magnetometer can operate in self-calibration mode, when the appropriate bias and modulation amplitude are selected. This bias dependent inflection at precisely zero magnetic field produces a sharp derivative feature in the second harmonic that is approximately 0.15 mT in spacing. As this feature is attributed to the strength of the spin interactions, the spacing will remain constant as a function of temperature and time. As a result, they are magnetic field markers that may serve to self-calibrate the magnetometer.

FIG. 20 illustrates an alternative form of self-calibration leveraging EDMR. This method involves adding a small coil or resonator, built into the circuit board, which subjects the device to low-frequency RF radiation. The field frequency relationship of the defect resonant transition, as well as the half-field forbidden transitions indicated by the red arrows, provides an absolute measurement which can be used to validate the ZFSDR measurement.

The second calibration method (as in FIG. 20) involves electrically detected magnetic resonance (EDMR) of the atomic scale defects. The hardware required for this mode depends on the magnetic field being measured. For example, the hardware requirements needed when operating in a relatively high magnetic field such as on the surface of Earth (>50,000 nT) or low Earth orbit is different to that required for other field intensities. In some embodiments, the magnetometer is designed to measure fields no higher than 10,000 nT, corresponding to electron resonances at 280 kHz. These lower field intensities requirements simplify the hardware needed. When immersed in such low-fields, the instrument needs no additional hardware and can leverage the 3 axis coil system already employed to perform EDMR.

First, a constant current is fed through one of the coils (such as the z axis coil), thus generating a well-known constant magnetic field in that dimension. Then, a rotating magnetic field (sinusoid frequency modulated) is applied to the x and y coils (each axis phase separated by 90 degrees, respectively) at the resonant frequency of the electrons. This technique avoids the Bloch-Siegert shift typically encountered with a linearly polarized electromagnetic wave usually leveraged to induce EDMR. Firmware will demodulate the measured sensor current and attempt to maximize the resonance signal (zero-crossing) by controlling (with a firmware PI controller) the resonant frequency applied to the x and y coils. The frequency is therefore a direct measurement of the ambient (scalar field) in which the sensor is immersed. This scalar data can be used to determine not only the offsets and scale-factors for each axis, but can also be used to determine the misalignment of the sensor using a least-squares estimator. The other two configurations can be used to verify the measured scalar field. For example, a constant field applied in the y direction, a rotating field applied in the x-z plane or a constant field applied in the x direction, and a rotating field applied in the y-z plane.

In some embodiments, the sensors of the present disclosure have a 440 nT/$\sqrt{Hz}$ sensitivity or higher. The pn junction can be optimized for magnetometry. A custom device can be designed to exploit the ZFSDR recombination phenomenon. Tradeoffs between geometry, sensing area, doping, and annealing can be made to find the optimum line shape and response. Once processed and fabricated, the sensitivity can be significantly enhanced by creating stable silicon vacancy defects by exposing the devices to high energy electron radiation as was done for optical magnetometry methods in SiC. These defect engineering methods can help increase $\Delta I$ and improve sensitivity.

In some embodiments the device can be fabricated using isotopically pure SiC, that is SiC in which the crystal is depleted of magnetic isotopes of $^{29}$Si or $^{13}$C. This can sharpen the linewidth $\sigma$, and push the sensitivity higher. Even though the hyperfine interactions are responsible for the magneto-response, the 1.1% magnetically abundant $^{13}$C and 4.7% magnetically abundant $^{29}$Si (and magnetic dopant atoms) can contribute to the breadth of the signal and limit the ultimate sensitivity. Using an isotopically purer material can allows to better control point defect creation and limit the amount of random electron nuclear hyperfine interactions, thereby sharpening the magneto-response. Improved electronics which leverage low-noise ICs, layout practices, and sigma-delta ADC sampling can improve SNR, sensitivity, and stability of the measurement.

Figure 21:
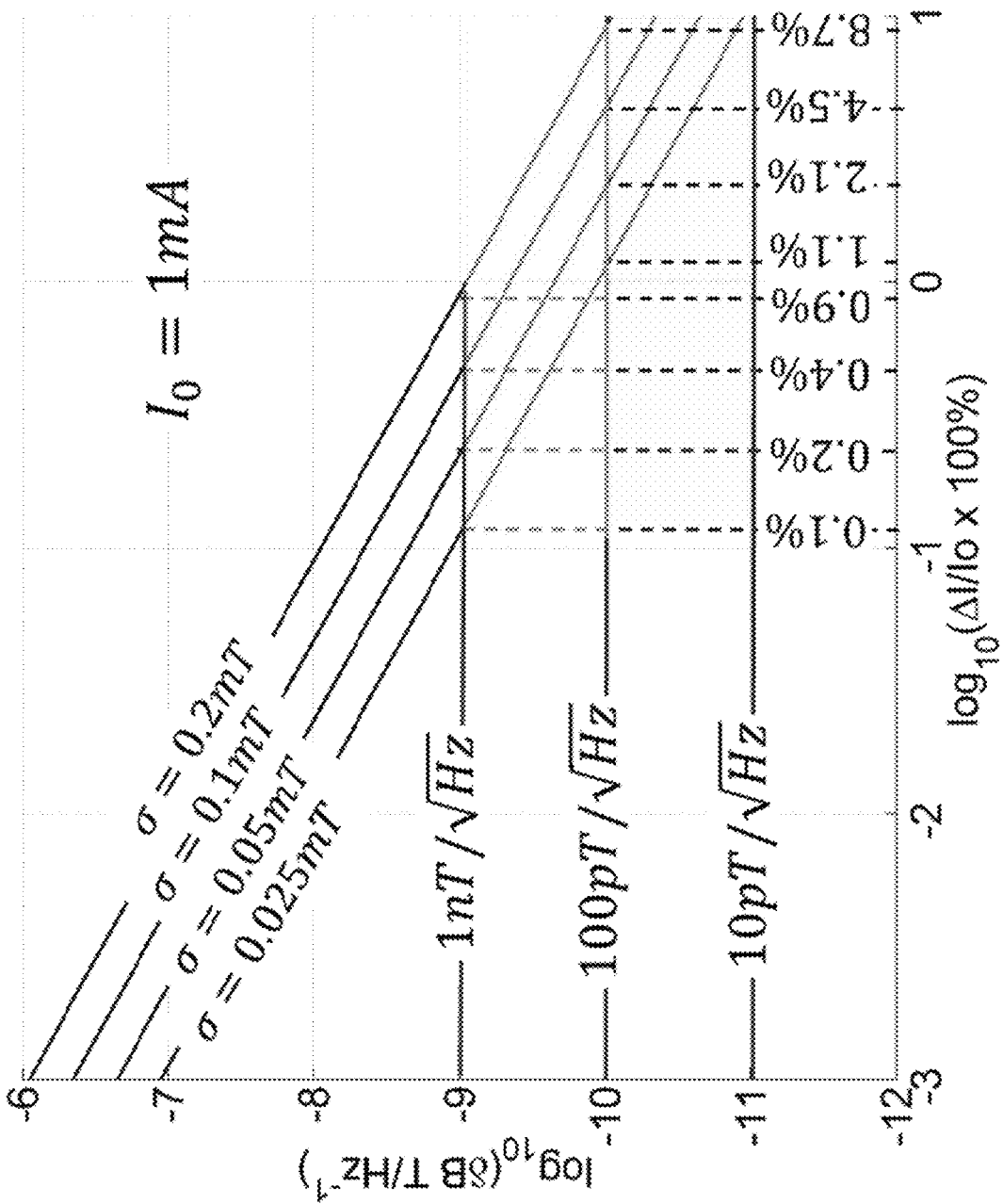
FIG. 21 illustrates the sensitivity of magnetometers, given by Eq. 5, as a function of percent change in current.

FIG. 21 illustrates the sensitivity of magnetometers, given by Eq. 5, as a function of percent change in current (100%× $\Delta I/I_0$) for SiC devices with linewidths of $\sigma$=0.2 mT, 0.1 mT, 0.05 mT, and 0.025 mT and $I_0$=1 mA DC current for all four cases. As illustrated in FIG. 21, the 1 nT/$\sqrt{Hz}$ is attainable using the method outlined above in the present disclosure. In some embodiments, the sensors may employ diamond and GaN as these materials have relatively large bandgaps and a crystalline structure. For example, diamond has a sharp response attributed to the small number of hyperfine interactions from the $^{13}$C atoms.

In some embodiments, the devices of the present disclosure can be fabricated with a source/drain to substrate pn junction of a 4H—SiC n-channel lateral MOSFET. The device was fabricated on a p-type substrate which was Al doped to about 6×10$^{15}$. The source and drain n-wells were created by P implantation. The device has a channel area (L×W) of 400×400 μm$^2$ and the gate oxide is a 50 nm thermally grown ONO stack (10 nm SiO$_2$/30 nm Si$_3$N$_4$/10 nm SiO$_2$) which received a 5 minute Ar anneal at 1600° C. A custom designed preamp was used for amplification and signal conditioning. A NI USB-6289 M Series DAQ card was used to digitize the amplified device current and also used to generate three modulation waveforms with configurable offset, frequency, and phase.

In the following, the present disclosure describes the magnetic sensing capabilities of two 4H—SiC n$^+$p diodes which only differ in the implanted ion species, nitrogen and phosphorus, and the implant activation annealing time. Low- and high-field electrically detected magnetic resonance (EDMR) is used to investigate the defect structure employed to sense magnetic fields. The sensitivity of the sensors is also evaluated. In addition, the devices are exposed to high energy electron radiation to evaluate the defect sensing capability in a harsh radiation environment. The results described in the following allow designing a 4H—SiC pn diode for magnetic field sensing in harsh environments.

The present disclosure describes how to facilitate the magnetic resonance properties of spin-carrying quantum centers in solid state materials, for the detection of magnetic fields Electrical readout of quantum centers has even been shown to be accessible in fully processed 4H—SiC devices by measuring small changes in current associated with resonant (EDMR) and non-resonant (zero-field mixing) spin dependent recombination (SDR). In some embodiments, the magnetometer uses the source/drain pn junction region of an experimental 4H SiC MOSFET (P-implant, gate area 400× 400 μm$^2$) which was characterized with a magnetic field sensing sensitivity of about 400 nT/$\sqrt{Hz}$. This embodiment may not be ideal for space applications due to the presence of an oxide which has the potential to accumulate charge from electron and ion radiation sources. In other embodiments, more suitable for space applications, a custom sensor comprises 4H—SiC vertical pn junction diode structures.

The sensitivity metric used to evaluate the magnetometer is based on Eq. (5). In the following, a sensor parameter is evaluated: the effect of the ion implantation species used for doping the SiC semiconductor. The magnetic field sensing capability of two sets of nearly identical n$^+$p diodes was evaluated. The 250 μm diameter diodes were formed by the same high-dose n-type implantations used to make source/drain regions for two different JFET IC wafer runs, contacted by a 162 μm diameter IrIS metal stack.

The major difference between the two sets of diodes is that one set received a nitrogen (N) implant with a 4 hour activation annealing time while the other set received a phosphorus (P) implant with a ~100 hour activation annealing time at substrate temperature of 600° C. The spectroscopic technique of low-field (B$_0$~8.9 mT, v~250 MHz) and high-field (B$_0$~339 mT, v~9.5 GHz) electrically detected magnetic resonance (EDMR) was used to investigate the deep-level defects responsible for SDR in the N- and P-implanted diodes. The low-field technique not only allows the observation of the resonance of the electrons tied up in the defects, but also allows simultaneously the observation of the magnetoresistive response. The which magnetoresistive response is referred to as zero-field SDR.

Figure 22:
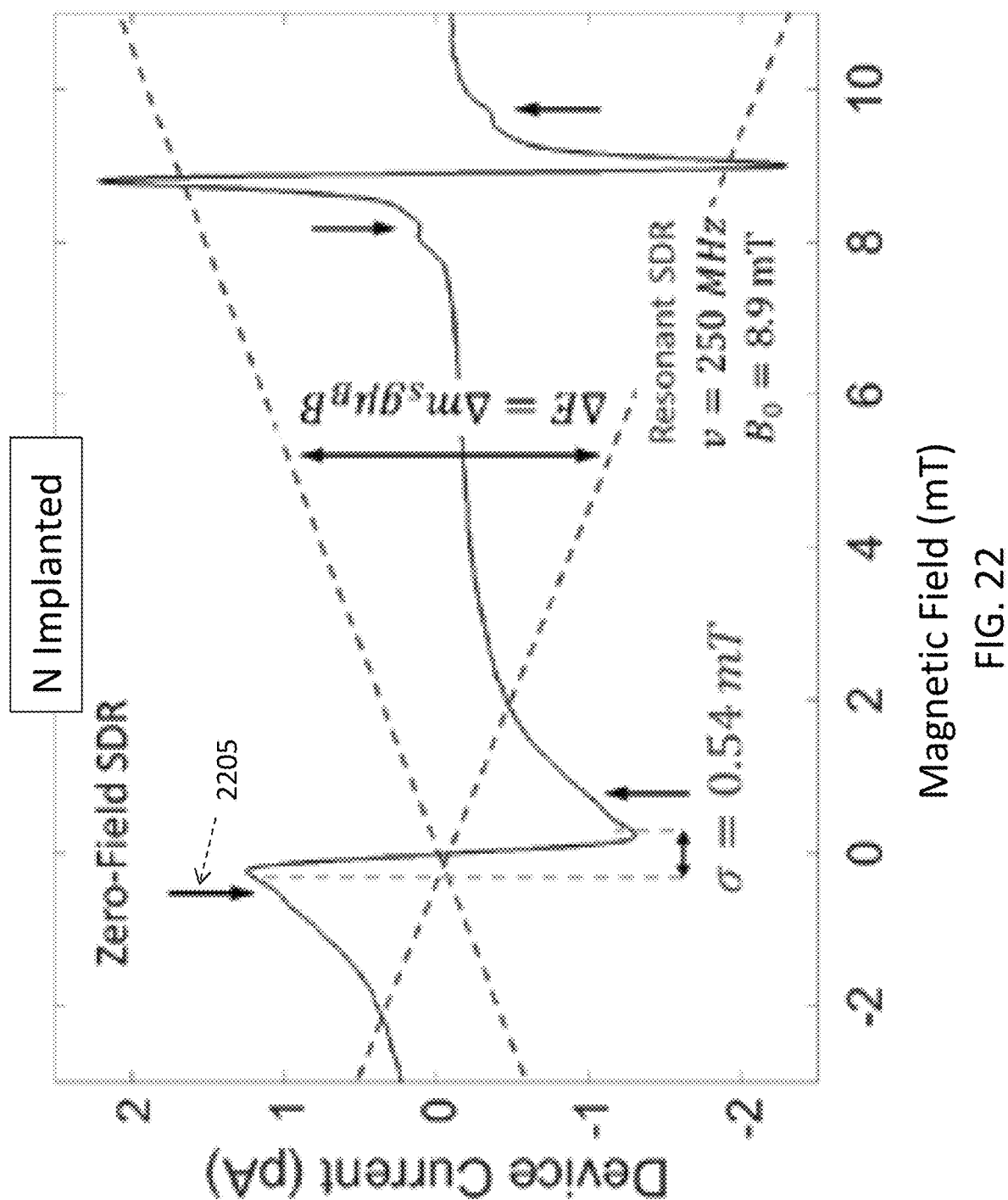
FIGS. 22-24 illustrate the data gathered on the N-implanted diode.
Figure 23:
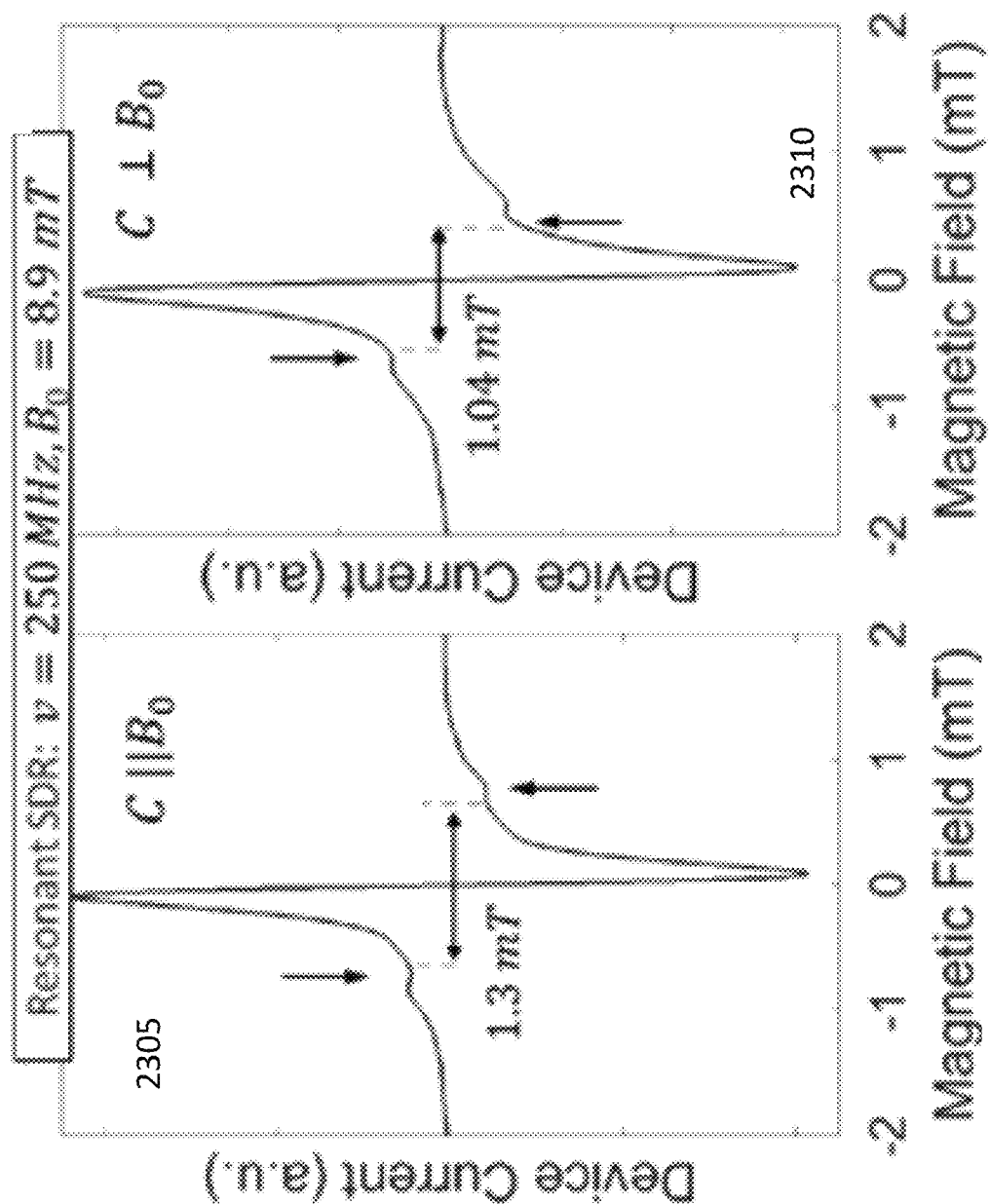
Figure 24:
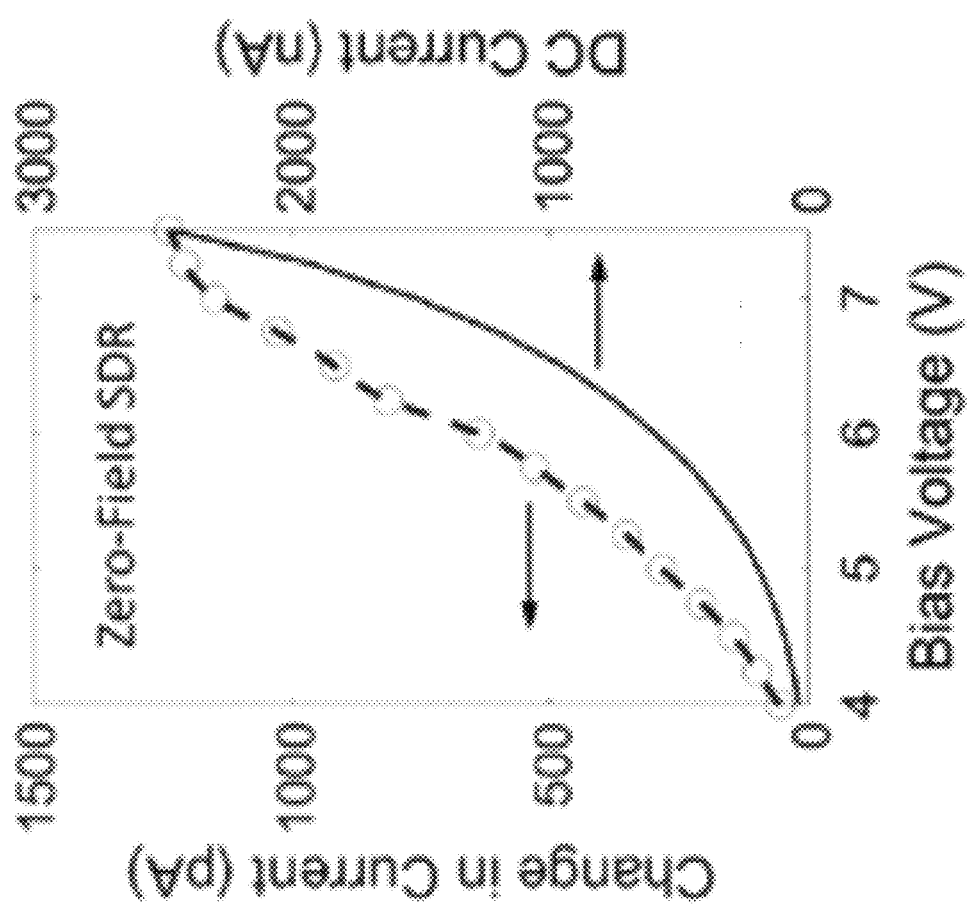

FIGS. 22-24 illustrate the data gathered on the N-implanted diode. FIG. 22 illustrates a low-field measurement (0.15 mT modulation) with the zero-field (0 mT) and resonant SDR (8.9 mT) signals present. The hyperfine structure in both signals is indicated by arrows (2205). FIG. 23 illustrates a better resolved low-field EDMR response (0.15 mT modulation) with the B$_0$ field parallel and perpendicular to the crystalline c-axis, respectively. It can be noted that the spacing between the hyperfine peaks reduces from 1.3 mT to 1.04 mT when the sample is rotated with respect to the applied magnetic field. FIG. 24 illustrates the change in the integrated zero-field SDR current $\Delta I$ and the DC current $I_0$ as a function of applied bias. In some embodiments, the sensitivity of the N-implanted devices is about 1000 nT/$\sqrt{Hz}$ when biased with 6.5 V.

FIGS. 22-24 illustrate data from an N-implanted diode. FIG. 22 illustrates the low-field EDMR spectrum illustrating both zero-field and resonant SDR responses. FIG. 23 illustrates the Low-field EDMR spectrum with (2305) B$_0$ parallel to the crystalline c-axis and (2310) with B$_0$ perpendicular to the crystalline c-axis. FIG. 24 illustrates the change in the integrated zero-field SDR current and DC current as a function of applied bias.

Figure 25:
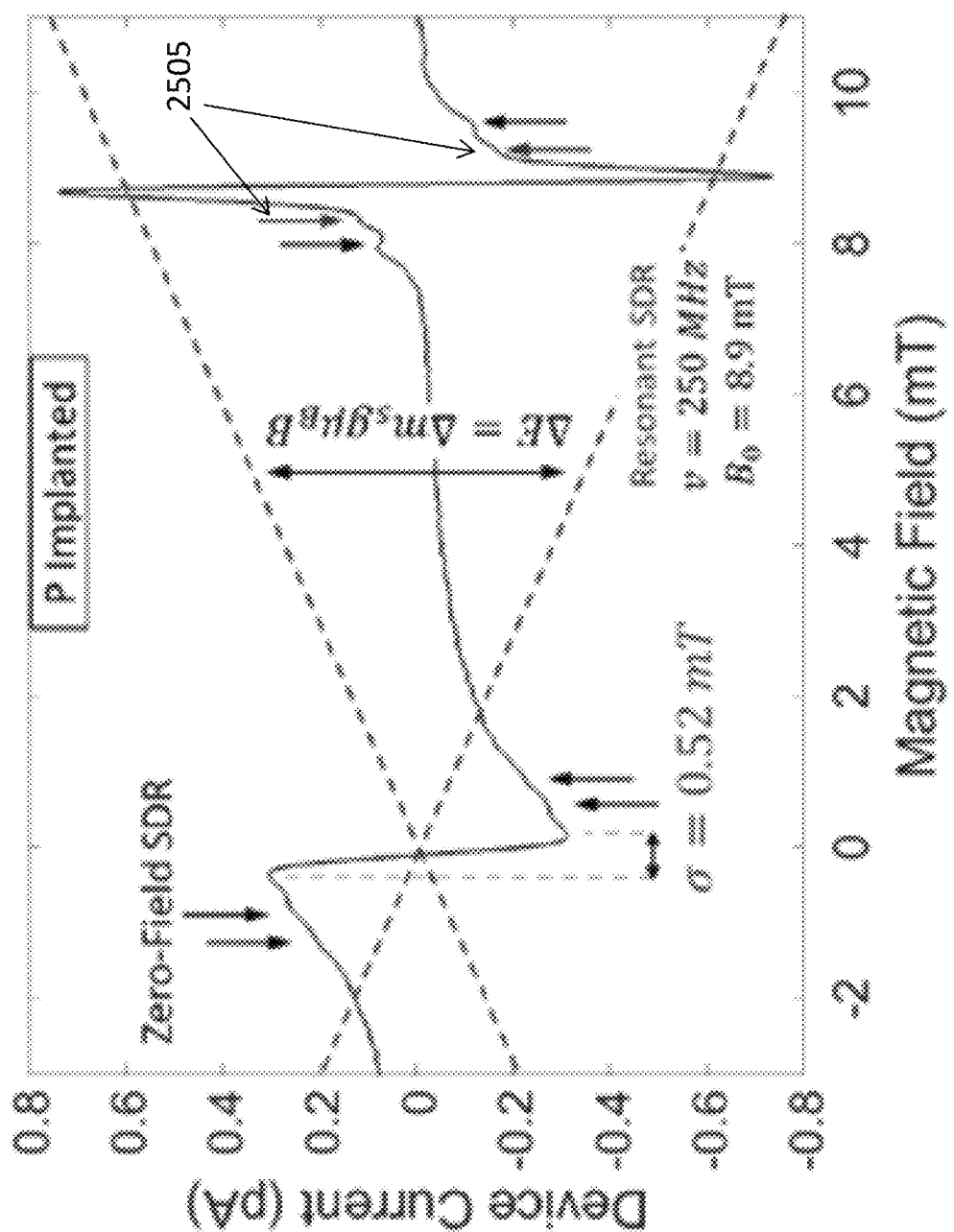
FIGS. 25-27 illustrate data from a P-implanted diode.
Figure 26:
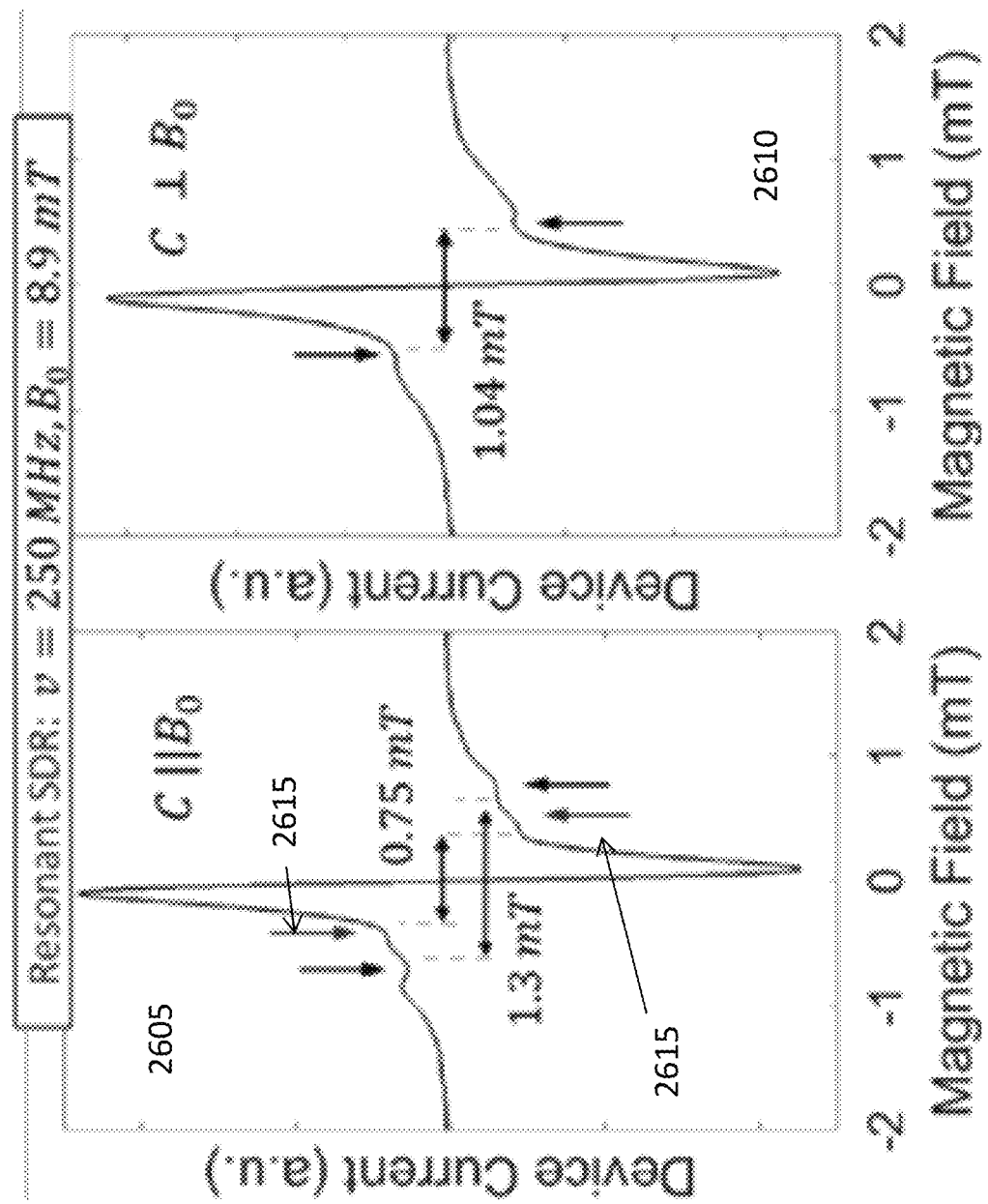
Figure 27:
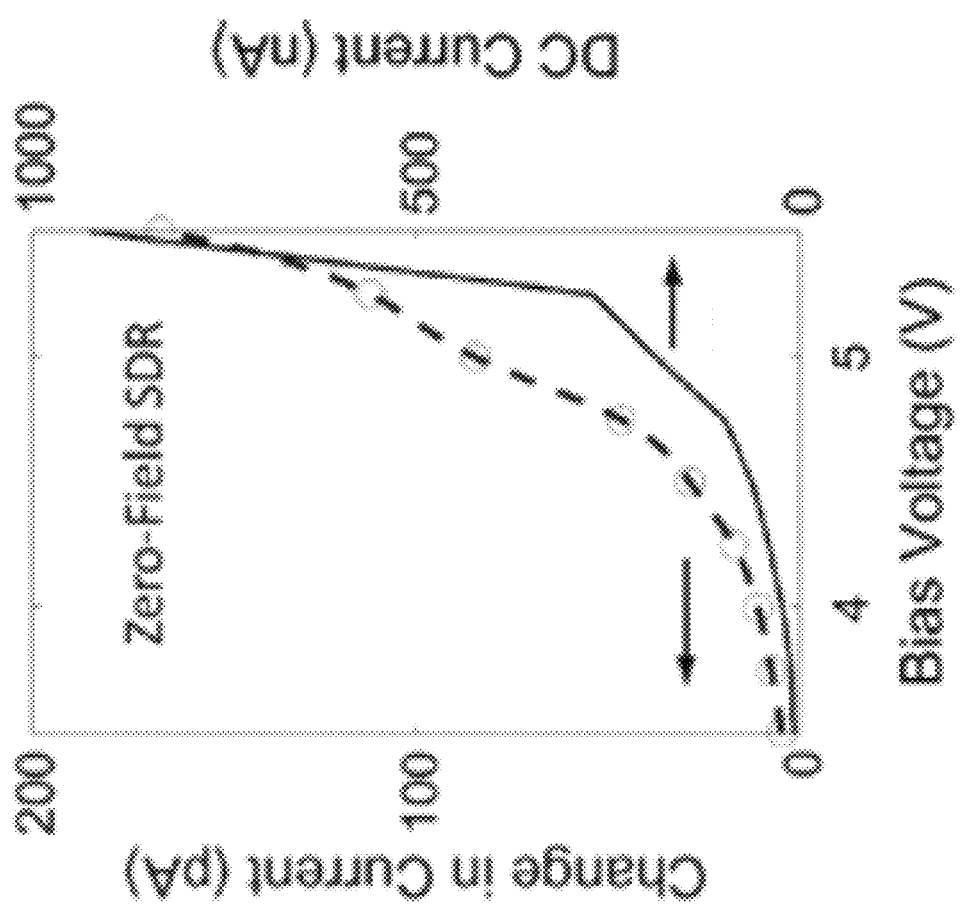

FIGS. 25-27 illustrate data from a P-implanted diode. FIG. 25 illustrates the low-field EDMR spectrum with both zero-field and resonant SDR responses. FIG. 26 illustrates low-field EDMR spectrum with (2605) B$_0$ parallel to the crystalline c-axis and (2610) with B$_0$ perpendicular to the crystalline c-axis. FIG. 27 illustrates the change in the integrated zero-field SDR current and DC current as a function of applied bias.

When comparing the two data sets, for the N and P implanted sensors, there are two main important differences. The first noticeable difference is that, even though the dominant defect appears to be the same in both devices, there appears to be an additional set of more pronounced hyperfine side peaks in the P-implanted device as illustrated by the second set of arrows (2505) in FIG. 25 and (2615) in FIG. 26. These side peaks are spaced ~0.75 mT apart when the $B_0$ field is parallel to the crystalline c-axis and disappear into the central line when rotated 90°. It is likely that these additional side peaks are due to a secondary defect involving a complex coupled to a neighboring $I=\frac{1}{2}$ phosphorus atom.

Figure 28:
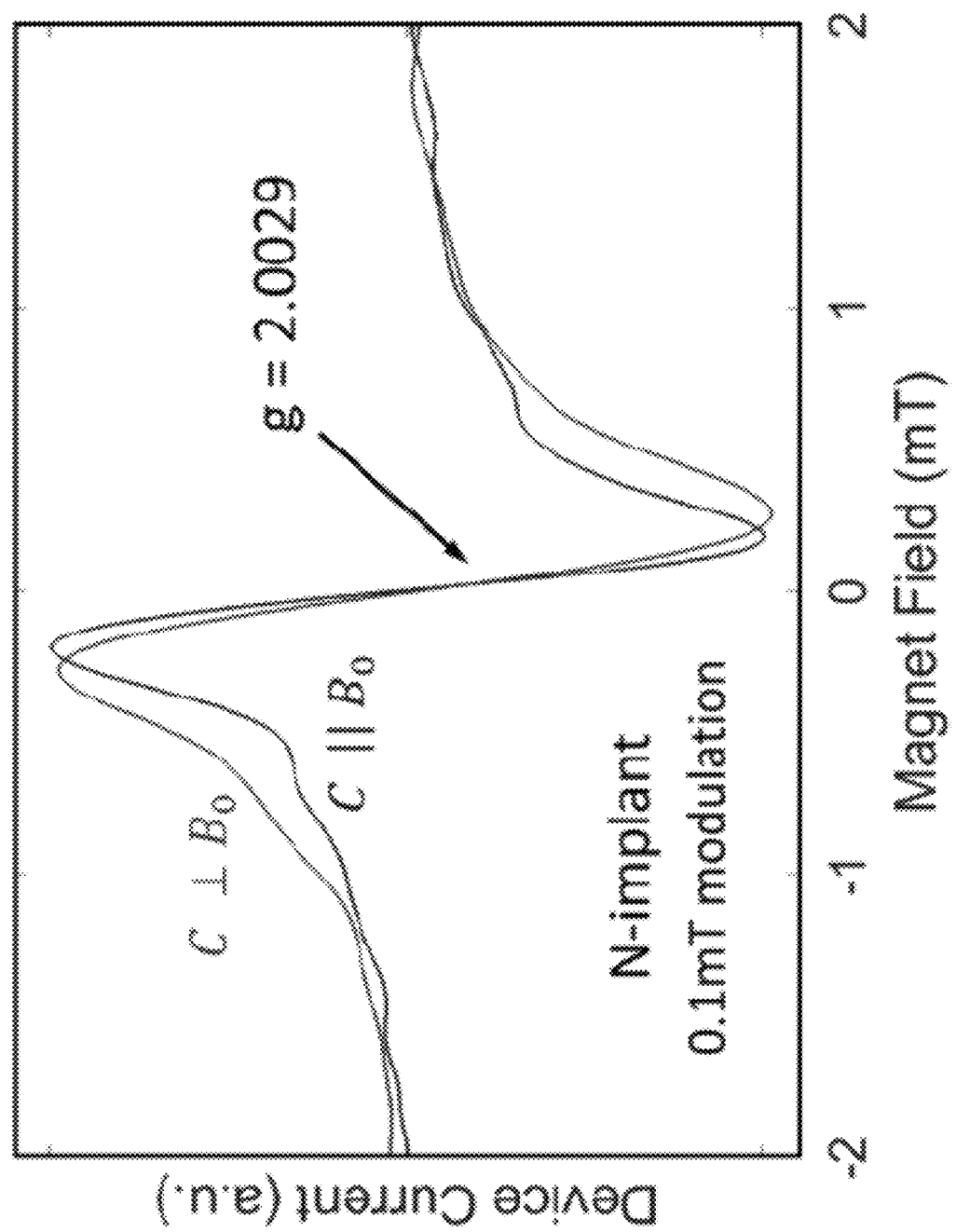
FIGS. 28-29 illustrate X-band EDMR data.
Figure 29:
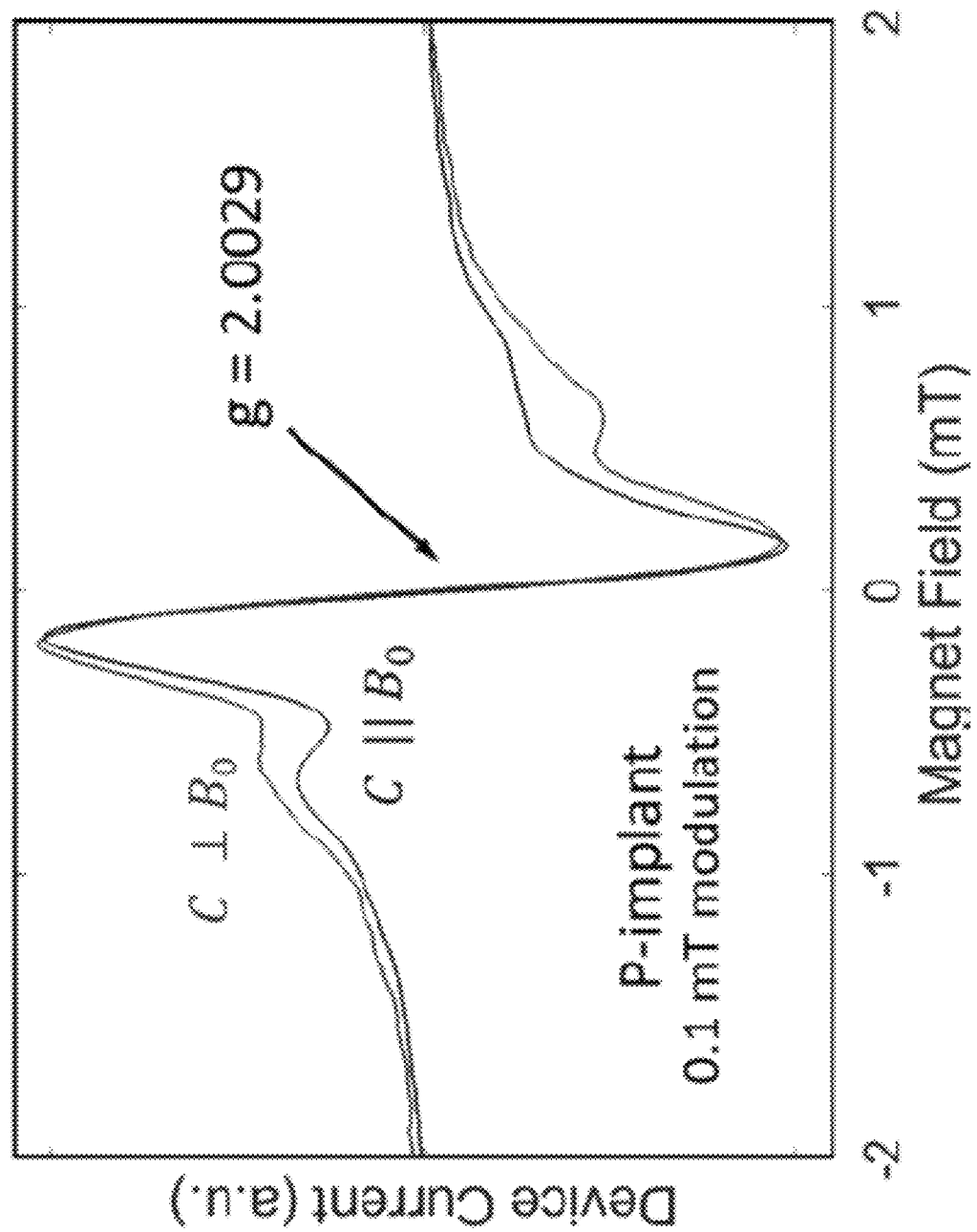
Figure 30:
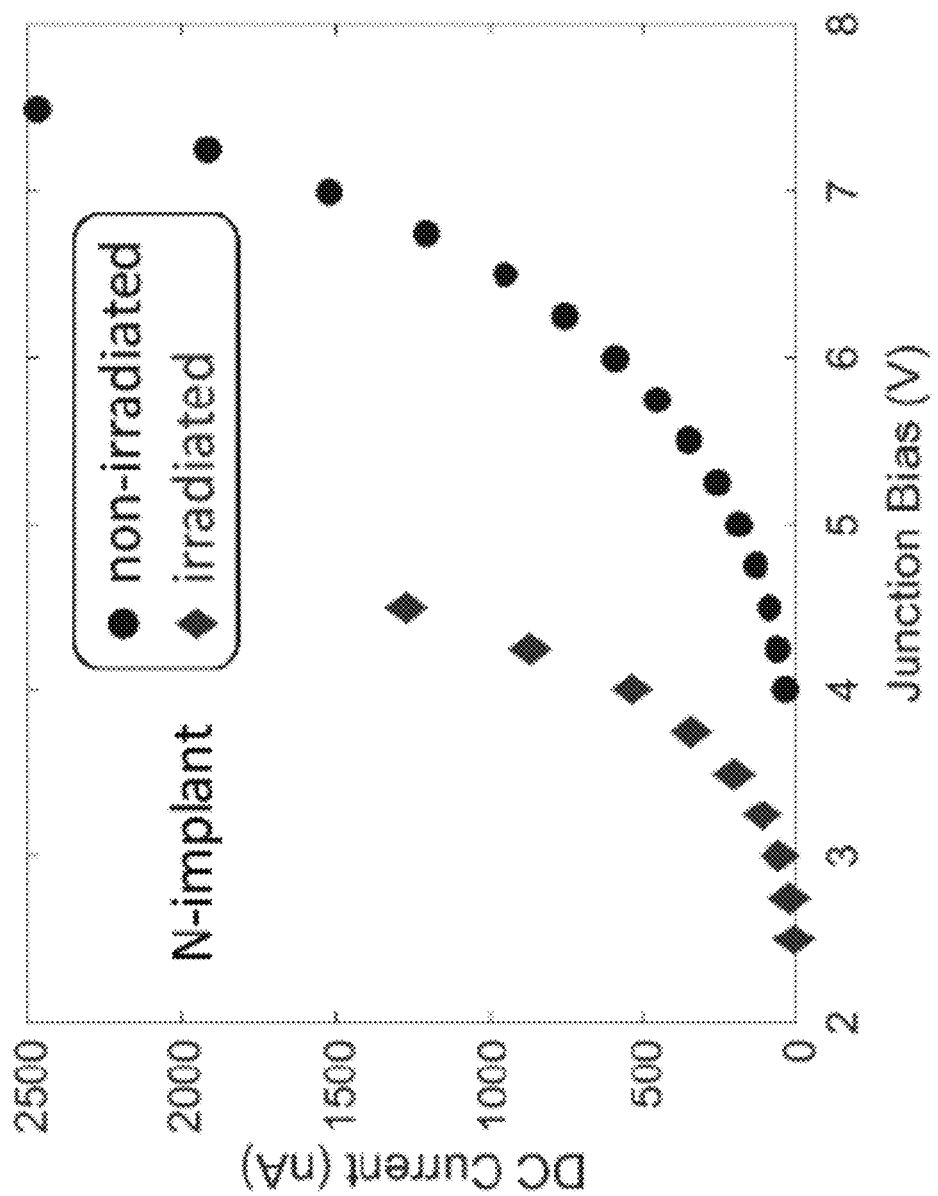
FIGS. 30-35 illustrate a comparison of the DC current $I_0$, change in current $\Delta I$ (integrated raw data), and approximate sensitivity $\delta B$ versus the applied junction bias for both electron irradiated and non-irradiated devices.
Figure 31:
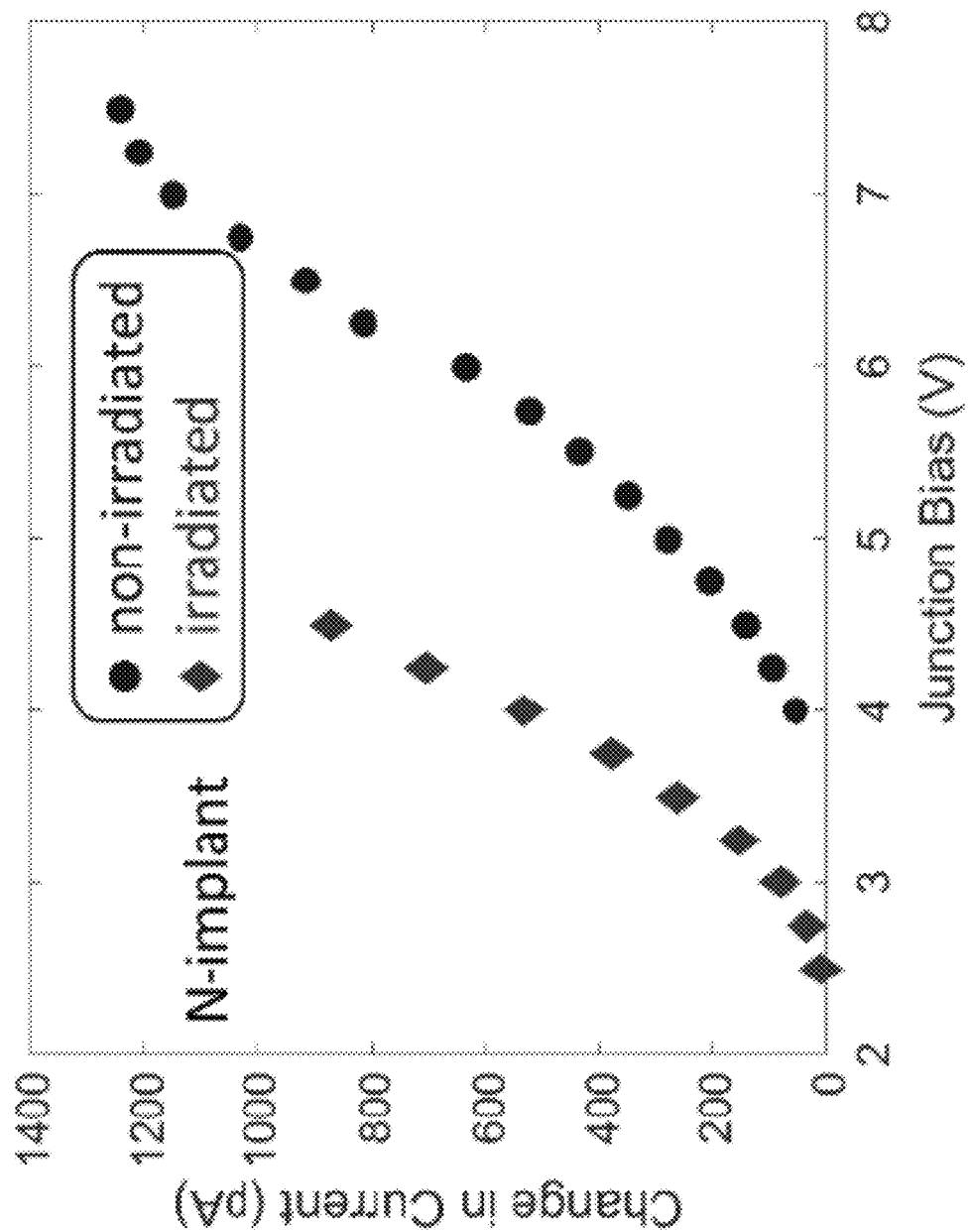
Figure 32:
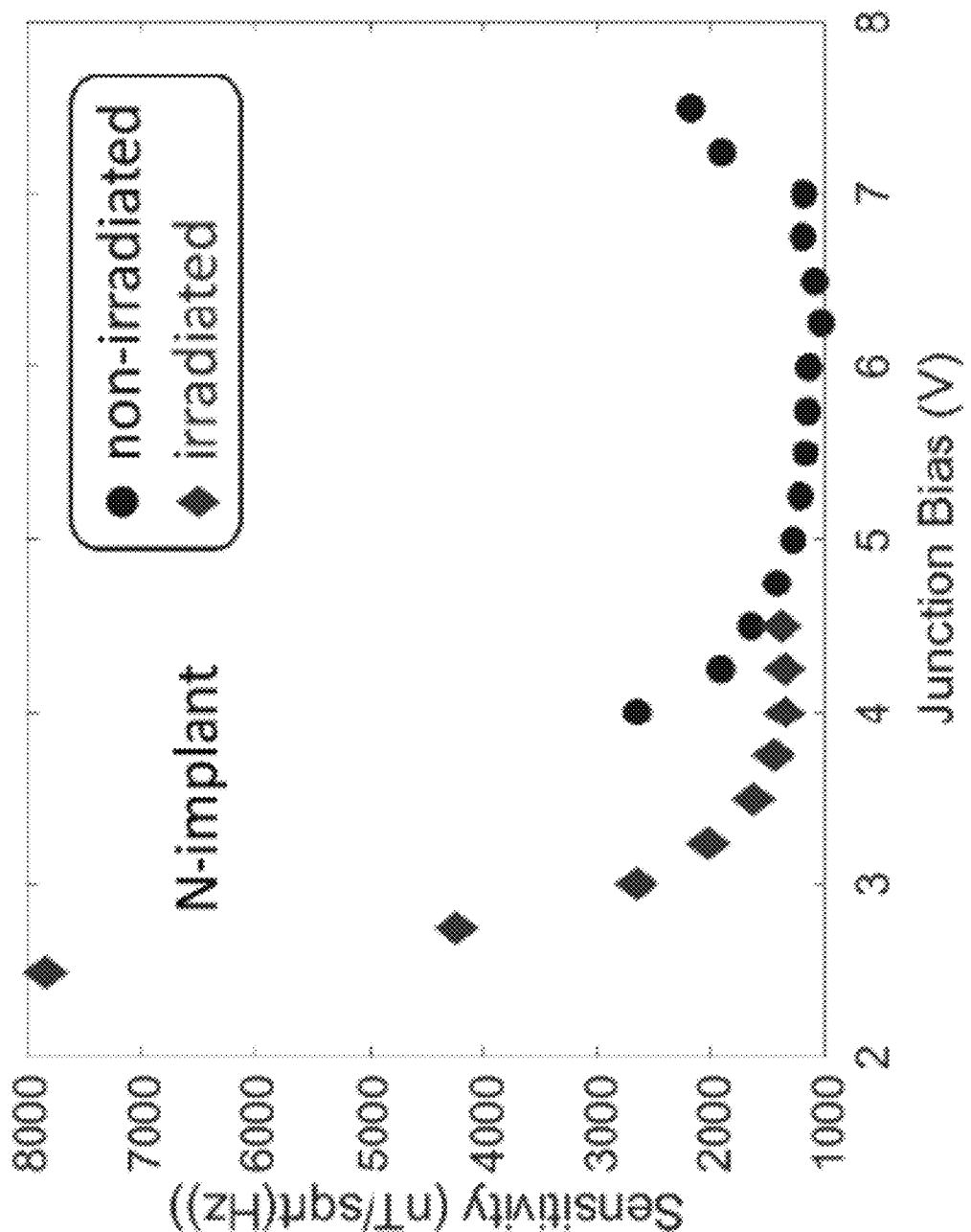
Figure 33:
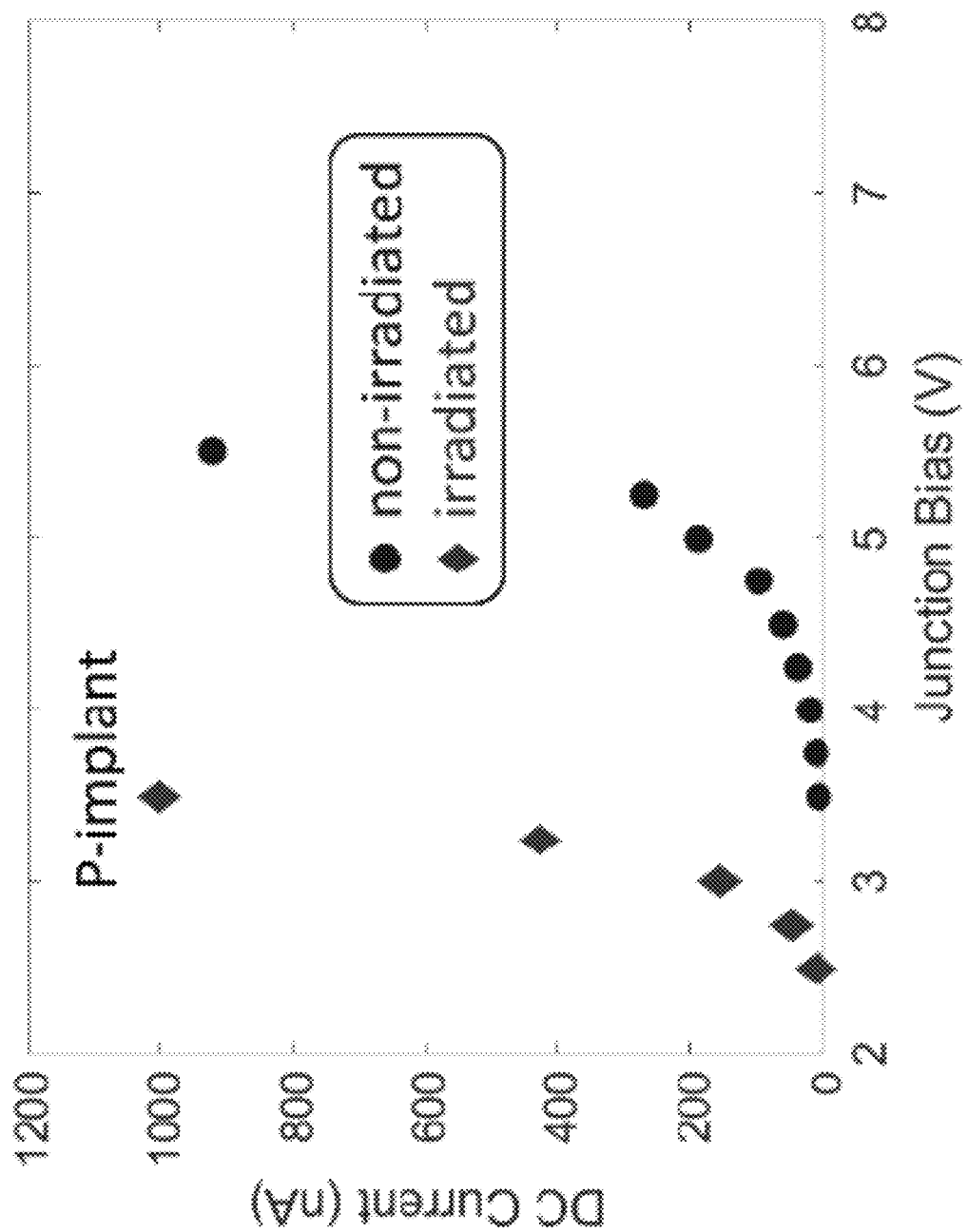
Figure 34:
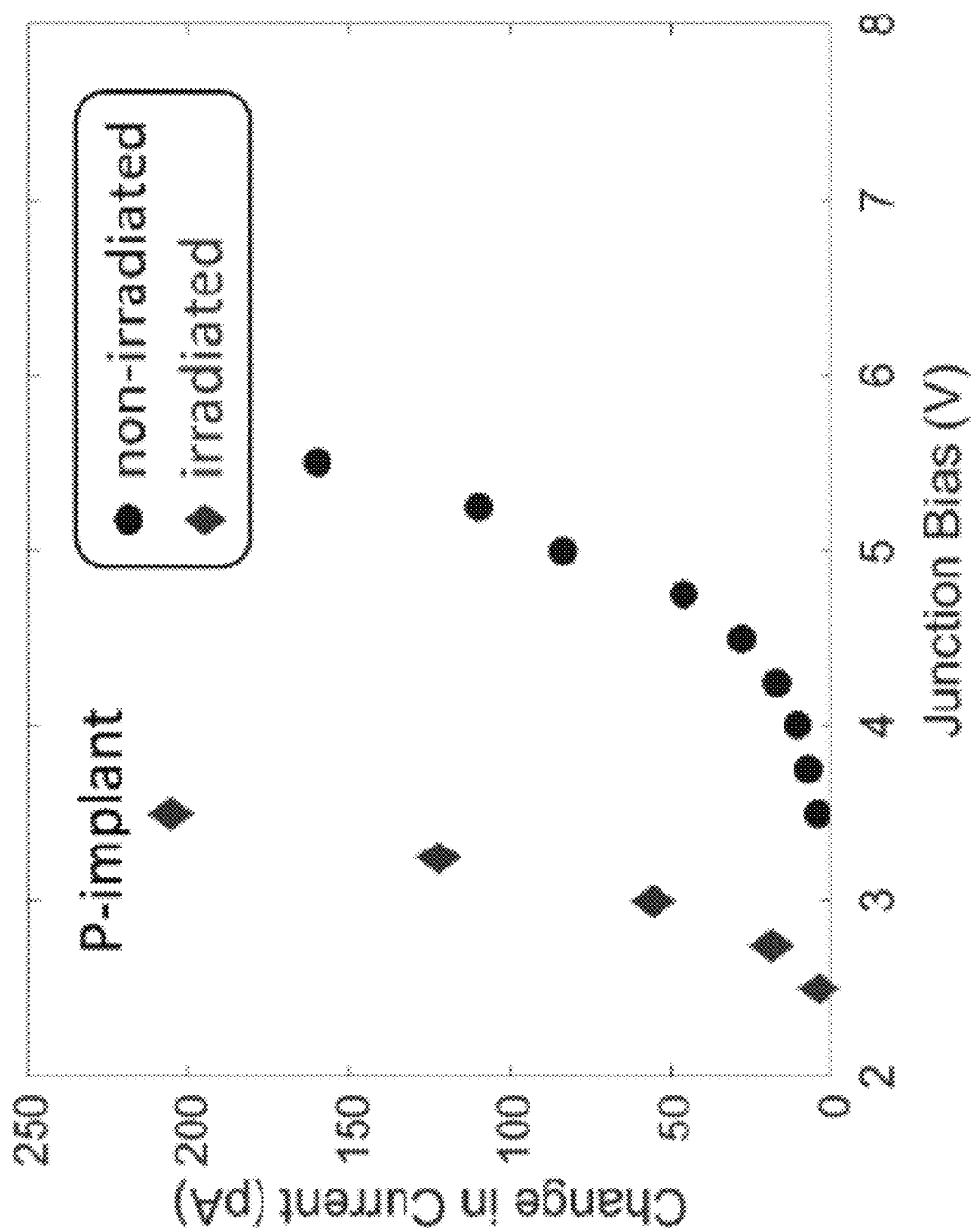
Figure 35:
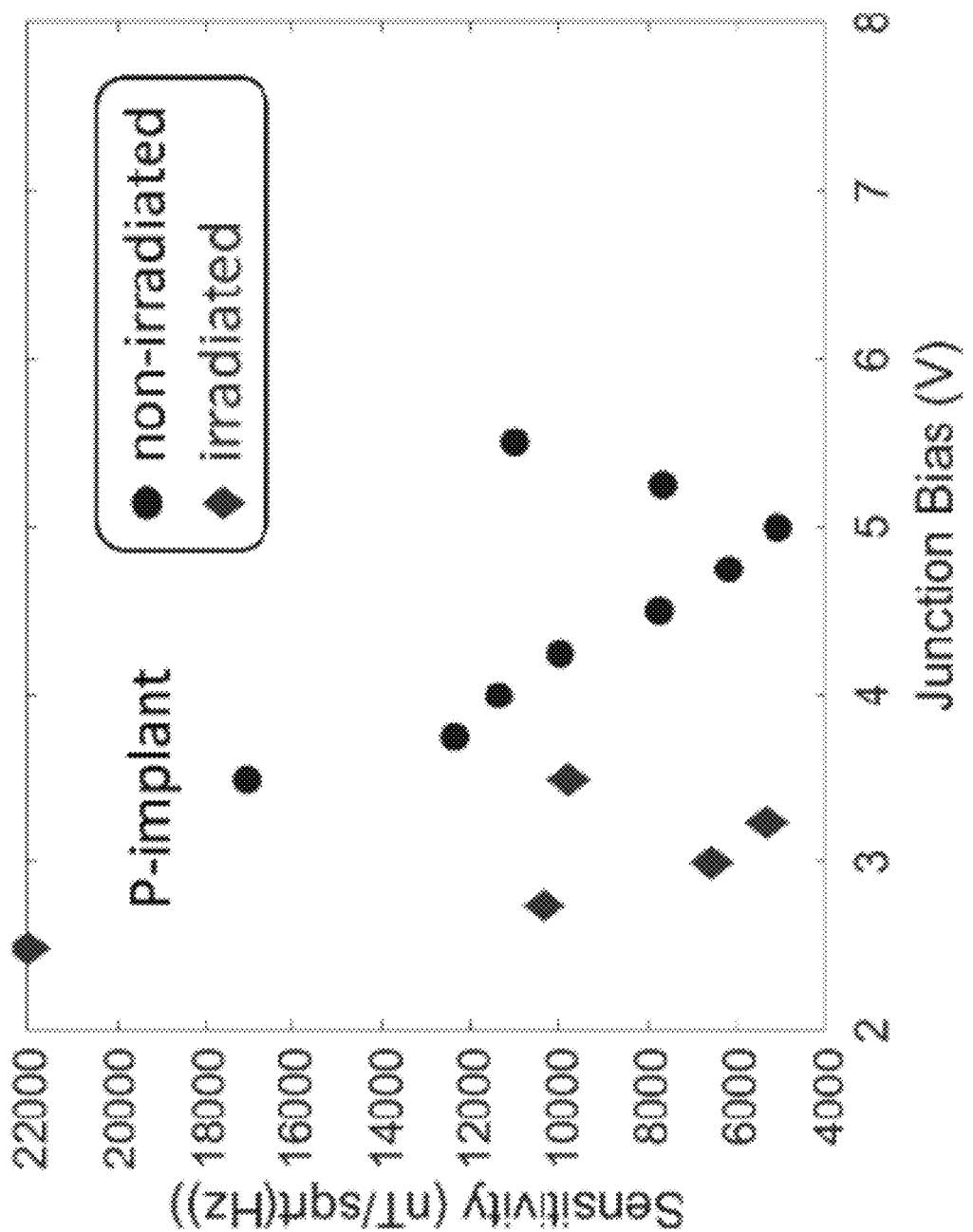

The other noticeable difference between the two data sets is that both the change in integrated zero-field current $\Delta I$ and DC current $I_0$ are significantly lower for the P-implanted devices, suggesting that there are fewer defects that contribute to recombination. In fact, the highest sensitivity measured, in this embodiment, for the P-implanted devices was about 5000 nT/$\sqrt{Hz}$ with 5 V applied to the junction. High-field measurements (X-band) were performed to more precisely investigate the orientation dependence of the g and hyperfine parameters of the defect under observation. FIGS. 28-29 illustrate the X-band EDMR data on both N- and P-implanted devices, with the crystalline-c axis oriented parallel and perpendicular to the applied magnetic field.

The clear difference between these measurements (9.5 GHz) and their associated low-field measurement (0.25 GHz) is that the N-doped devices appear significantly broadened at X-band, which can be attribute to a higher level of disorder around the defects. This result can be understood considering the N-doped devices are significantly more damaged than the P-doped devices. Additionally, the X-band measurements corroborate the anisotropic nature of the hyperfine interactions observed in the low-field measurements (although broadened in the N-doped case). In both cases, the dominant center line is characterized as having an isotropic g≈2.0029±0.0001, which is consistent with a silicon vacancy. FIG. 28 illustrates X-band EDMR data obtained from the N-implanted diodes, while FIG. 29 illustrates data obtained from the P-implanted diodes. In both cases the crystalline c-axis is orientated parallel and perpendicular to the applied magnetic field.

In order for the sensor to operate reliably in space and harsh planetary environments, in some embodiments the sensor needs to be able to withstand radiation doses in excess tens of Mrad. In order to test the sensors performance in an analogous environment, an electron irradiation facility was used to expose the sensors to comparable electron doses (fluence of $1\times10^{14}$ e/cm$^2$, energy of 2 MeV) with both contacts of the diodes tied to a common ground.

FIGS. 30-35 compare the DC current $I_0$, change in current $\Delta I$ (integrated raw data), and approximate sensitivity $\delta B$ versus the applied junction bias for both irradiated and non-irradiated devices. From the data in FIGS. 30-35, it can be noted that for both N- and P-doped irradiated devices, a smaller junction bias may be required, in some embodiments, to achieve the same DC current $I_0$ and change in SDR current $\Delta I$ (and hence $\delta B$). This result can indicates that the built-in voltage of the diodes is reduced after exposure to the high-energy electrons. It can also be noted, however, that the optimum sensitivity is unaffected in each device, although a slightly smaller bias is required to achieve the same metric. These results demonstrate the robustness of the SiC sensor as a magnetic field sensing device with much promise for harsh radiation environments. In some embodiments, the devices of the present disclosure have a sensitivity of 1 μT/$\sqrt{Hz}$.

FIGS. 30-35 illustrate a comparison of DC current I, change in current $\Delta I$, and sensitivity $\delta B/\sqrt{\Delta f}$ as a function of applied bias for non-irradiated and irradiated N implanted (FIGS. 30-32) and P implanted (FIGS. 33-35) 4H SiC diodes.

The measurements illustrated in FIGS. 30-35 show that, in some embodiments, the "as processed" nitrogen-implanted 4H—SiC diodes are plagued with more atomic scale defects than identical structures implanted with phosphorus. While the implant anneals were substantially different, this result suggests that the N-implanted diodes may be, in some embodiments, better suited for magnetic field sensing applications. In addition, data obtained from exposure to electron radiation similar to that encountered in a planetary system such as Jupiter indicate that minimal degradation to magnetometer performance is achieved over the anticipated mission lifetime of the sensor.

In some embodiments, the semiconductor used in the magnetometer has a band gap of at least 3 eV, ensuring resistance to radiation interference. In some embodiments, Helmholtz coils are used. Helmholtz coils, as known to the person of ordinary skill in the art, produce a region of nearly uniform magnetic field. These coils consist of two electromagnets on the same axis. Helmholtz coils can be used to cancel external magnetic fields. In some embodiments, a Helmholtz coil consists of two identical circular magnetic coils that are placed symmetrically along a common axis. To have vectorized detection, three such pairs can be used. As understood by the person of ordinary skill in the art, deep levels are atomic defects in the SiC crystalline structure (or other semiconductor crystalline structure) which have an energy level within the band gap of the semiconductor, without being too close to either the valence or the conduction bands. Atomic defects are generally created by implanting atoms of different atomic numbers, and may consist of vacancies, such as a missing Si atom, as well as interstitials, antisites, substitutional, or divacancies. Defects with energy levels close to either band will generally become dopants, and can be termed as p-type if they donate a hole, or n-type if they donate an electron. If the defect level is not too close to the bands, the state will generally not become a dopant.

In some embodiments, the junction of a sensor is operated in forward bias mode. As known to the person of ordinary skill in the art, fluxgates are magnetometers generally comprising a magnetically susceptible core wrapped by multiple sets of coils. As understood by the person of ordinary skill in the art, near-zero magnetic field sensing refers to sensing of magnetic fields close to a value of zero. As known to the person of ordinary skill in the art, 4H SiC is a polytype of SiC. In some embodiments, one polytype or another may be used for the magnetometers. As known to the person of ordinary skill in the art, a pn junction has a region with p dopants and a region with n dopants, with a characteristic energy difference between the bands of both regions. The energy difference can be increased, or lowered, by the application of a voltage drop to the semiconductor junction.

The present disclosure describes a magnetometer based on a semiconductor junction within three sets of Helmholtz coils. The magnetometer relies on the electronic circuitry being configured to cancel the magnetic field with the coils and deduce the external magnetic field by its proportionality to the current required to cancel the field. The electrons in the atomic defects in the semiconductor junction are spin-coupled to the conduction band electrons. The spin coupling is sensitive to the external magnetic field, therefore the field generates a change in the spin-dependent recombination. This in turn means that the current is coupled to the external magnetic field.

In some embodiments, the magnetometer comprises: a semiconductor pn junction having a first region and a second region, the first region being an electron carrier region, and the second region being a hole carrier region; three sets of Helmholtz coils, the three sets of Helmholtz coils being mutually orthogonal, each set of Helmholtz coils comprising two circular coils configured to generate a magnetic field along a center axis direction of the two circular coils, thus generating three mutually orthogonal magnetic field components; and electronic circuitry configured to: drive a current in each set of the three sets of Helmholtz coils to generate the three mutually orthogonal magnetic field components, and maximize a spin-dependent recombination current in the semiconductor pn junction, thereby measuring an external magnetic field based on the current driven in each set.

In some embodiments: each magnetic field component of the three mutually orthogonal magnetic field components comprises a low frequency component and a modulated component at a frequency higher than the low frequency; each low frequency component is configured to nullify the external magnetic field; each low frequency component has a frequency less than 50 Hz; the digital proportional integral controllers are configured to detect changes in a spacing of electron-nuclear hyperfine peaks; the magnetometer has a sensitivity of at least 1 or 440 nT/$\sqrt{Hz}$; the semiconductor pn junction is depleted of $^{29}$Si or $^{13}$C.

In some embodiments, the digital proportional integral controllers are configured to sweep the low frequency magnetic field component (which is used to null the external field during sensing) across a magnetic field intensity value of zero to measure the spacing of electron-nuclear hyperfine peaks. In some embodiments, the electronic circuitry is configured to self-calibrate the magnetometer based on electrically detected magnetic resonance, by: generating, by a first set of the three sets of Helmholtz coils, a constant polarizing magnetic field, generating, by a second set of the three sets of Helmholtz coils and a third set of the three sets of Helmholtz coils, a rotating magnetic field in a plane perpendicular to the constant polarizing magnetic field, the rotating magnetic field having a frequency corresponding to resonance of electrons within the plurality of defects, modulating the frequency of the rotating magnetic field, thereby obtaining an absolute scalar magnetic field measurement, calibrating, based on the absolute scalar magnetic field measurement, three orthogonal vectorized magnetic field measurements, calculating offsets, scale factors, and non-orthogonality for each axis of the three orthogonal vectorized magnetic field measurements, based on a least squares estimation.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The references in the present application, shown in the reference list below, are incorporated herein by reference in their entirety.

REFERENCES

[1] C. J. Cochrane, et al., *J. Appl. Phys.*, 112, 123714, (2012).
[2] C. J. Cochrane, et al., *Appl. Phys. Lett.*, 103, 053506 (2013).
[3] W. J. Baker, et al., *Nat. Comm.*, 3, 898 (2012).
[4] C. J. Cochrane, et al, *Scientific Reports* volume 6, Article number: 37077 (2016)

What is claimed is:

1. A magnetometer comprising:
    a semiconductor pn junction having a first region and a second region, the first region being an electron carrier region, and the second region being a hole carrier region;
    three sets of Helmholtz coils, the three sets of Helmholtz coils being mutually orthogonal, each set of Helmholtz coils comprising two circular coils configured to generate a magnetic field along a center axis direction of the two circular coils, thus generating three mutually orthogonal magnetic field components; and
    electronic circuitry configured to:
        drive a current in each set of the three sets of Helmholtz coils to generate the three mutually orthogonal magnetic field components, and
        maximize a zero-field spin-dependent recombination (SDR) current in the semiconductor pn junction, thereby measuring an external magnetic field based on the current driven in each set,
    wherein the electronic circuitry is configured to self-calibrate the magnetometer based on electrically detected magnetic resonance, by:
        generating, by a first set of the three sets of Helmholtz coils, a constant polarizing magnetic field,
        generating, by a second set of the three sets of Helmholtz coils and a third set of the three sets of Helmholtz coils, a rotating magnetic field in a plane perpendicular to the constant polarizing magnetic field, the rotating magnetic field having a frequency corresponding to resonance of electrons within the plurality of defects,
        modulating the frequency of the rotating magnetic field, thereby obtaining an absolute scalar magnetic field measurement,
        calibrating, based on the absolute scalar magnetic field measurement, three orthogonal vectorized magnetic field measurements, and
        calculating offsets, scale factors, and non-orthogonality for each axis of the three orthogonal vectorized magnetic field measurements.

2. The magnetometer of claim 1, wherein each magnetic field component of the three mutually orthogonal magnetic field components comprises a low frequency component and a modulated component at a frequency higher than the low frequency.

3. The magnetometer of claim 2, wherein each low frequency component is configured to null the external magnetic field.

4. The magnetometer of claim 3, wherein each low frequency component has a frequency less than 50 Hz.

5. The magnetometer of claim 2, wherein the electronic circuitry comprises a digital proportional integral controller for each set of Helmholtz coils.

6. The magnetometer of claim 5, wherein the digital proportional integral controllers are configured to sweep each low frequency component across a magnetic field intensity value of zero to measure a spacing of electron-nuclear hyperfine peaks.

7. The magnetometer of claim 6, wherein the electronic circuitry is configured to self-calibrate the magnetometer based on the measured spacing of electron-nuclear hyperfine peaks.

8. The magnetometer of claim 1, wherein the semiconductor pn junction comprises SiC.

9. The magnetometer of claim 8, wherein the semiconductor pn junction comprises a plurality of dopants selected from the group consisting of: Al, N, B, Ga, As, and P.

10. The magnetometer of claim 8, wherein the semiconductor pn junction is depleted of magnetic isotopes of $^{29}$Si or $^{13}$C.

11. The magnetometer of claim 1, wherein the semiconductor pn junction comprises a plurality of defects selected from the group consisting of: atomic vacancy, interstitial, divacancy, substitutional, and antisite.

12. The magnetometer of claim 1, wherein the magnetometer has a sensitivity of better than 440 nT/$\sqrt{Hz}$.

13. The magnetometer of claim 1, wherein the magnetometer has a sensitivity of better than 1 nT/$\sqrt{Hz}$.

14. The magnetometer of claim 1, wherein the semiconductor pn junction comprises diamond or GaN.

15. The magnetometer of claim 1, wherein the semiconductor pn junction comprises a semiconductor with a band gap equal to or greater than 3 eV.

16. The magnetometer of claim 1, wherein the electronic circuitry comprises three demodulators, configured to measure a change in the zero-field SDR current.

17. The magnetometer of claim 1, wherein the electronic circuitry comprises a preamplifier.

18. The magnetometer of claim 1, wherein the magnetometer is a miniaturized magnetometer and is a purely electrically based magnetometer.

19. A magnetometer comprising:

a semiconductor pn junction having a first region and a second region, the first region being an electron carrier region, and the second region being a hole carrier region;

three sets of Helmholtz coils, the three sets of Helmholtz coils being mutually orthogonal, each set of Helmholtz coils comprising two circular coils configured to generate a magnetic field along a center axis direction of the two circular coils, thus generating three mutually orthogonal magnetic field components; and electronic circuitry configured to:

drive a current in each set of the three sets of Helmholtz coils to generate the three mutually orthogonal magnetic field components, and maximize a zero-field spin-dependent recombination (SDR) current in the semiconductor pn junction, thereby measuring an external magnetic field based on the current driven in each set, wherein the electronic circuitry is configured to self-calibrate the magnetometer based on electrically detected magnetic resonance, by:

generating, by a first set of the three sets of Helmholtz coils, a constant polarizing magnetic field, generating, by a second set of the three sets of Helmholtz coils and a third set of the three sets of Helmholtz coils, a rotating magnetic field in a plane perpendicular to the constant polarizing magnetic field, the rotating magnetic field having a frequency corresponding to resonance of electrons within the plurality of defects, modulating the frequency of the rotating magnetic field, thereby obtaining an absolute scalar magnetic field measurement, and calibrating, based on the absolute scalar magnetic field measurement, three orthogonal vectorized magnetic field measurements.

* * * * *